(12) United States Patent
Liu et al.

(10) Patent No.: US 12,333,117 B2
(45) Date of Patent: Jun. 17, 2025

(54) TOUCH STRUCTURE, DISPLAY PANEL AND TOUCH DISPLAY DEVICE

(71) Applicant: BOE Technology Group Co., Ltd., Beijing (CN)

(72) Inventors: Liyan Liu, Beijing (CN); Yingtao Wang, Beijing (CN); Xinxing Wang, Beijing (CN); Jaegeon You, Beijing (CN); Xuefei Sun, Beijing (CN); Kuanjun Peng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/029,487

(22) PCT Filed: Apr. 29, 2022

(86) PCT No.: PCT/CN2022/090499
§ 371 (c)(1),
(2) Date: Mar. 30, 2023

(87) PCT Pub. No.: WO2023/206440
PCT Pub. Date: Nov. 2, 2023

(65) Prior Publication Data
US 2024/0361869 A1 Oct. 31, 2024

(51) Int. Cl.
G06F 3/044 (2006.01)
H10K 59/40 (2023.01)

(52) U.S. Cl.
CPC .......... *G06F 3/0446* (2019.05); *H10K 59/40* (2023.02); *G06F 2203/04112* (2013.01)

(58) Field of Classification Search
CPC .............................. G06F 3/044; G06F 3/0443
See application file for complete search history.

(56) References Cited

U.S. PATENT DOCUMENTS

| | | | |
|---|---|---|---|
| 2014/0077186 A1 | 3/2014 | Kim | |
| 2014/0218642 A1* | 8/2014 | Iwami | G06F 3/0446 174/250 |
| 2015/0022738 A1 | 1/2015 | Chou et al. | |
| 2015/0070374 A1 | 3/2015 | Gong | |
| 2016/0209967 A1 | 7/2016 | Ku | |
| 2020/0075691 A1 | 3/2020 | Zhou et al. | |

(Continued)

FOREIGN PATENT DOCUMENTS

| | | |
|---|---|---|
| CN | 103681755 A | 3/2014 |
| CN | 104298388 A | 1/2015 |

(Continued)

*Primary Examiner* — Yuzen Shen
(74) *Attorney, Agent, or Firm* — ArentFox Schiff LLP; Michael Fainberg

(57) ABSTRACT

The disclosure provides a touch structure, a display panel and a touch display device. The touch structure includes a metal mesh including a plurality of metal wires. The metal mesh is provided with a plurality of opening units, each of the opening units includes at least three openings, each of the openings is enclosed by a plurality of metal wires, and the plurality of metal wires enclosing each of the openings have at least three different extending directions; at least one of the metal wires separating the openings in the opening unit and each of the metal wires forming an outer boundary of the opening unit have different extending directions.

6 Claims, 27 Drawing Sheets

(56) References Cited

U.S. PATENT DOCUMENTS

2021/0408155 A1  12/2021  Wang
2022/0069027 A1   3/2022  Wang et al.
2023/0068518 A1   3/2023  Kuo et al.

FOREIGN PATENT DOCUMENTS

| | | |
|---|---|---|
| CN | 104656966 A | 5/2015 |
| CN | 106990858 A | 7/2017 |
| CN | 109427851 A | 3/2019 |
| CN | 110364556 A | 10/2019 |
| CN | 111736726 A | 10/2020 |
| CN | 111799320 A | 10/2020 |
| CN | 112181210 A | 1/2021 |
| CN | 113257883 A | 8/2021 |
| CN | 113268152 A | 8/2021 |
| CN | 113504845 A | 10/2021 |
| JP | 2013069261 A | 4/2013 |
| JP | 2016173697 A | 9/2016 |

\* cited by examiner

TOUCH STRUCTURE, DISPLAY PANEL AND TOUCH DISPLAY DEVICE

CROSS REFERENCE TO RELATED APPLICATIONS

This application is a national phase entry under 35 U.S.C. § 371 of International Application No. PCT/CN2022/090499, filed on Apr. 29, 2022, the entire content of which is incorporated herein by reference.

FIELD

The disclosure relates to the field of display technology, in particular to a touch structure, a display panel and a touch display device.

BACKGROUND

With continuous development of electronic products, display panels with functions of touch and display can realize simple and flexible human-computer interaction, and are therefore widely used. The touch display panel includes, for example, a one glass solution (OGS) display panel, an on-cell display panel and an in-cell display panel.

SUMMARY

The disclosure provides a touch structure, a display panel and a touch display device. The touch structure includes: a touch structure including a metal mesh. The metal mesh includes a plurality of metal wires. The metal mesh is provided with a plurality of opening units, each of the opening units includes at least three openings, each of the openings is enclosed by a plurality of metal wires, and the plurality of metal wires enclosing each of the openings have at least three different extending directions; at least one of the metal wires separating the openings in the opening unit and each of the metal wires forming an outer boundary of the opening unit have different extending directions.

In some embodiments, the number of the metal wires forming the outer boundary of the opening unit is greater than the number of the metal wires inside the opening unit.

In some embodiments, the metal wires forming the outer boundary of the opening unit at least include one pair of metal wires with the same extending direction.

In some embodiments, the outer boundary of the opening unit is a parallelepiped.

In some embodiments, the metal wires forming the outer boundary of the opening unit include: two first metal wires arranged oppositely and in parallel, two second metal wires arranged oppositely and in parallel, and two third metal wires arranged oppositely and in parallel. One of the two second metal wires connects one of the two first metal wires and one of the two third metal wires, and the other one of the two second metal wires connects the other one of the two first metal wires and the other one of the two third metal wires.

In some embodiments, the length of the third metal wire is greater than the length of the first metal wire, and the length of the first metal wire is greater than the length of the second metal wire.

In some embodiments, the second metal wire is perpendicular to the connected third metal wire.

In some embodiments, in the opening unit, a first included angle formed between the first metal wire and the connected second metal wire is the same as a second included angle formed between the first metal wire and the connected third metal wire.

In some embodiments, in the opening unit, the first included angle formed between the first metal wire and the connected second metal wire is in a range of 120° to 150°.

In some embodiments, the opening unit includes: two fourth metal wires extending from a midpoint of the first metal wire and perpendicular to the first metal wire, and two fifth metal wires extending along a direction parallel to the second metal wire and respectively connecting the other end of the fourth metal wire and a midpoint of the third metal wire.

In some embodiments, the length of the fourth metal wire is a half of the length of the first metal wire; and the length of the fifth metal wire is equal to the length of the second metal wire.

In some embodiments, the outer boundary of the opening unit is cross-shaped.

In some embodiments, the opening unit includes: two first convex parts opposed with one extending along a first direction and the other one extending in a direction opposite to the first direction, and two second convex parts opposed with one extending along a second direction and the other one extending in a direction opposite to the second direction; and the first direction is perpendicular to the second direction.

In some embodiments, the outer boundary of the first convex part includes: two sixth metal wires extending along the first direction, and a seventh metal wire connecting the two sixth metal wires and extending along the second direction. The outer boundary of the second convex part includes: two eighth metal wires extending along the second direction, and a ninth metal wire connecting the two eighth metal wires and extending along the first direction. The sixth metal wire of the first convex part is intersected with the eighth metal wire of the adjacent second convex part at a first node.

In some embodiments, the length of the sixth metal wire is greater than the length of the seventh metal wire, and the length of the eighth metal wire is greater than the length of the ninth metal wire.

In some embodiments, the opening unit includes: a tenth metal wire connecting two non-adjacent first nodes of the first convex part and the second convex part which are adjacent to each other, and an eleventh metal wire connecting a midpoint of the tenth metal wire and a first node at a side of the tenth metal wire.

In some embodiments, the opening unit includes: a first sub-opening unit and a second sub-opening unit. The first sub-opening unit and the second sub-opening unit each is of a mirror symmetrical structure, and the two first sub-opening units and the two sub-opening units form a repeating unit. In the repeating unit, two of the first sub-opening units are connected by reusing an opening to form a first combination C1; and two of the second sub-opening units are connected by reusing one opening to form a second combination. The repeating unit is formed by reusing two adjacent metal wires on an outer boundary of the first combination as metal wires of two different second sub-opening units.

In some embodiments, the outer boundary of the opening unit is a rectangle.

In some embodiments, the metal wires forming the outer boundary of the opening unit include: two twelfth metal wires extending along a third direction and arranged oppositely, and two thirteenth metal wires extending along the third direction and arranged oppositely, where one of the two thirteenth metal wires is connected respectively with one end of the two twelfth metal wires, and the other one of the thirteenth metal wires is connected respectively with the other end of the two twelfth metal wires. The opening unit, inside, includes: a fourteenth metal wire extending inwards from a point on the thirteenth metal wire and a fifteenth metal wire connecting two opposite twelfth metal wires, and the other end of the fourteenth metal wire is connected with one point on the fifteenth metal wire. At least one of the fourteenth metal wire and the fifteenth metal wire is not in parallel with either the third direction or the fourth direction.

In some embodiments, the fifteenth metal wire is a linear segment.

In some embodiments, the fifteenth metal wire includes two sub-metal wires extending in different directions.

In some embodiments, an included angle formed between one of the sub-metal wires and the fourth direction is a third included angle, the included angle formed between the other of the sub-metal wires and the fourth direction is a fourth included angle, and the third included angle is not equal to the fourth included angle.

In some embodiments, the third included angle is in a range of 10° to 45°, and the fourth included angle is in a range of 10° to 45°.

Embodiments of the disclosure further provide a display panel, including a base substrate, a display functional layer on a side of the base substrate, and the touch structure as provided in embodiments of the disclosure on a side of the display functional layer facing away from the substrate. The display functional layer includes a plurality of sub-pixels, and an orthographic projection of at least one of the openings on the base substrate at least surrounds an orthographic projection of one of the sub-pixels on the base substrate.

In some embodiments, the sub-pixels are in one-to-one correspondence with the openings, and the shape of an orthographic projection of at least part of the sub-pixels on the base substrate is similar to the shape of an orthographic projection of the opening on the base substrate.

In some embodiments, an orthographic projection of part of the sub-pixels on the substrate goes beyond an orthographic projection of the opening on the substrate.

In some embodiments, the sub-pixel includes red sub-pixels, green sub-pixels and blue sub-pixels. In the repeating unit, two of the first sub-opening units are connected through reusing the opening at which one of the green sub-pixels is located; and two of the second sub-opening units are connected through reusing the opening at which one of the green sub-pixels is located.

In some embodiments, the blue sub-pixels include a first blue sub-pixel and a second blue sub-pixel.

In some embodiments, an orthographic projection of the first blue sub-pixel on the base substrate and an orthographic projection of the second blue sub-pixel on the base substrate are respectively located within an orthographic projection of a first convex part on the base substrate and an orthographic projection of a second convex part on the base substrate adjacent to the first convex part.

In some embodiments, the first blue sub-pixel and the second blue sub-pixel are of an integrally connected structure.

In some embodiments, the first blue sub-pixel and the second blue sub-pixel are separate structures.

In some embodiments, the orthographic projection of the first blue sub-pixel on the base substrate and the orthographic projection of the second blue sub-pixel on the base substrate are respectively located within orthographic projections of two first convex parts on the base substrate.

Embodiments of the disclosure further provide a touch display device, including the display panel provided in embodiments of the disclosure.

DETAILED DESCRIPTION

Figure 1A:
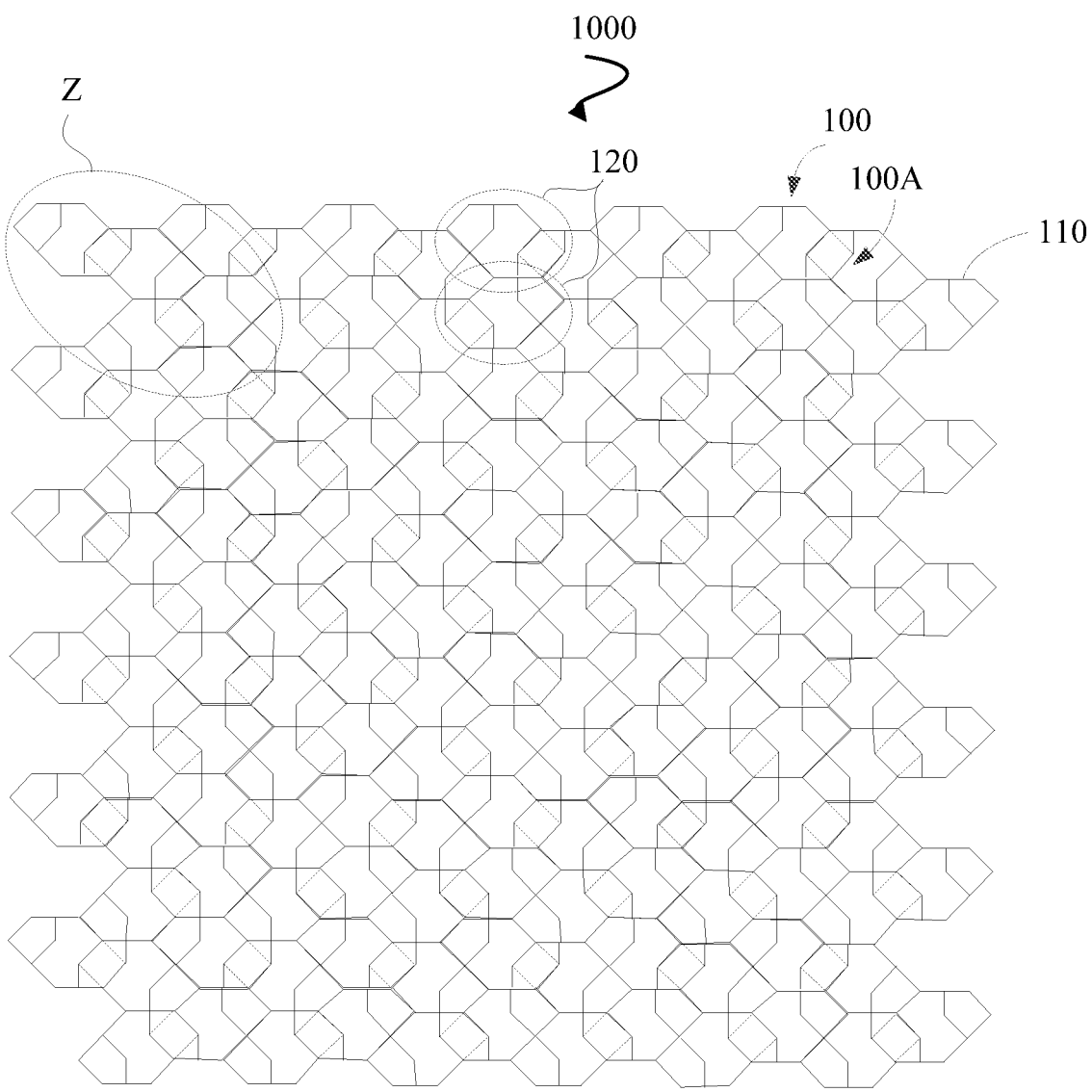
FIG. 1A is a schematic diagram of a touch structure provided by an embodiment of the disclosure.

Technical solutions of some embodiments of the disclosure will be clearly and completely described below in combination with accompanying drawings. Apparently, the described embodiments are merely a part but not all of the embodiments of the disclosure. All the other embodiments obtained by those skilled in the art without any creative effort based on the described embodiments of the disclosure shall all fall within the protection scope of the disclosure.

Unless otherwise required in the context, throughout the specification and the claims, the term "comprise" and its other forms such as the singular form in third personal "comprises" and the present participle form "comprising" are interpreted to mean openness and inclusiveness, that is, "including but not limited to". In the description of the specification, the terms "one embodiment", "some embodiments", "exemplary embodiments", "example", "specific example" or "some examples" and the like are intended to indicate that specific features, structures, materials or characteristics related to the embodiment or example are included in at least one embodiment or example of the disclosure. The schematic representations of the above terms do not necessarily refer to the same embodiment or example. Further, the particular features, structures, materials or characteristics may be included in any one or more embodiments or examples in any suitable manner.

The following terms "first" and "second" are merely used for descriptive purposes and cannot be understood as indicating or implying relative importance or implying the number of indicated technical features. Features thus defined as "first" and "second" may explicitly or implicitly include one or more such features. In the description of embodiments of the disclosure, "a plurality of" means two or more unless otherwise stated.

When some embodiments are described, "electrically connected" and "connected" and their extended expressions may be used. For example, the term "point connection" may be used in describing some embodiments to indicate that two or more components are in direct physical contact or electrical contact with each other. The embodiments disclosed herein are not necessarily limited to the content herein.

"A and/or B" includes the following three combinations: only A, only B and a combination of A and B.

The use of "configured" herein implies an open and inclusive language that does not exclude devices suitable for or configured to perform additional tasks or steps.

In addition, the use of "based on" means openness and inclusiveness, because a process, a step, calculations or other actions "based on" one or more of the conditions or values may be based on additional conditions or exceed the values in practice.

"Approximately" or "substantially" as used herein includes the values set forth and an average value within an acceptable deviation range of a particular value, wherein the acceptable deviation range is determined by those skilled in the art taking into account the measurements in question and the errors associated with the measurements of a particular quantity (i.e., limitations of a measurement system).

Exemplary embodiments are described herein with reference to sectional views and/or planar graphs as idealized exemplary drawings. In the accompanying drawings, the thicknesses of the layers and areas are enlarged for clarity. Therefore, variations in a shape relative to the accompanying drawings caused by, for example, manufacturing techniques and/or tolerances are envisaged. Therefore, the exemplary embodiments should not be interpreted as being limited to the shape of the areas shown herein but as including shape deviations caused by, for example, manufacturing. For example, an etched area shown as a rectangle will generally have curved features. Therefore, the areas shown in the accompanying drawings are schematic in nature and their shapes are not intended to show the actual shape of the area of the device and are not intended to limit the scope of the exemplary embodiments.

Along with rapid development of AMOLED (active matrix organic light-emitting diode) display devices, full screen, narrow bezel, high resolution, curling wearing and folding have become important development directions of the AMOLED in the future.

Based on a technology of fabricating a touch structure directly on an encapsulation layer of an OLED (organic light-emitting diode) display panel, lighter and thinner touch panels can be manufactured, and the technology can be applied to foldable and curled OLED display devices.

Based on considerations of reducing resistance and improving touch sensitivity, the touch electrode in the touch structure adopts metal meshes with advantages of small resistance, small thickness and fast reaction speed. In related art, the touch structure directly fabricated on an encapsulation layer of a display panel includes two types: a flexible metal layer on cell (FMLOC) and a flexible single layer on cell (FSLOC). Here, compared with FMLOC, the FSLOC is more convenient for product thinning.

Figure 4:
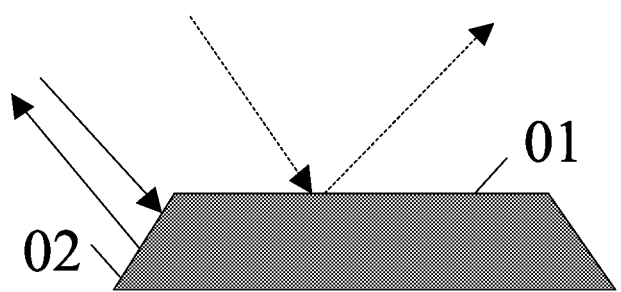
FIG. 4 is a reflected light path diagram of a symmetrical opening.

As shown in FIG. 4, FIG. 4 is a cross-sectional diagram of the metal wire forming a metal mesh. Under irradiation of strong light in a dark-state, the light irradiated onto the surface 01 of the metal wire will be blocked by a polarizer to which the display panel is attached and will not enter human eyes. The light irradiated onto a side wall 02 of the metal wire will not be blocked by the polarizer and will enter human eyes, and then a brightness difference will be formed in areas with and without metal wires, thereby causing human eyes to see bright and dark patterns.

Figure 11:
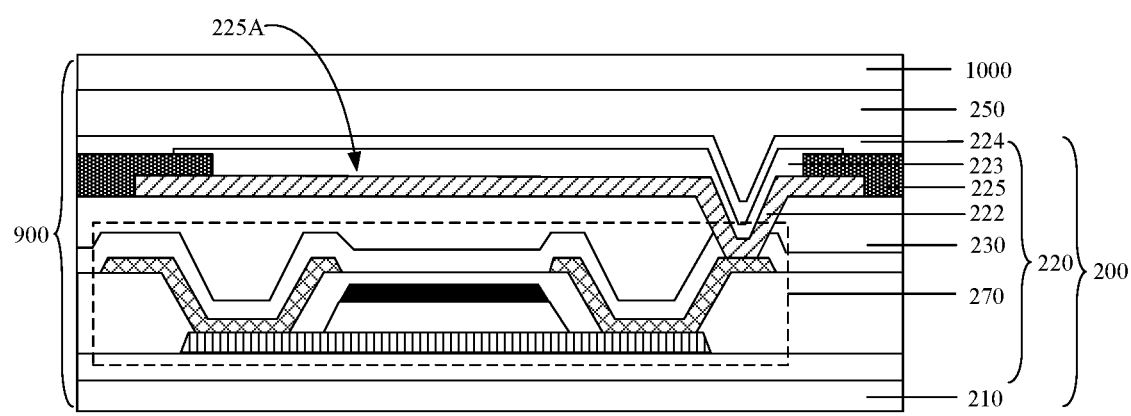
FIG. 11 is a sectional view of a display panel according to some embodiments.
Figure 12:
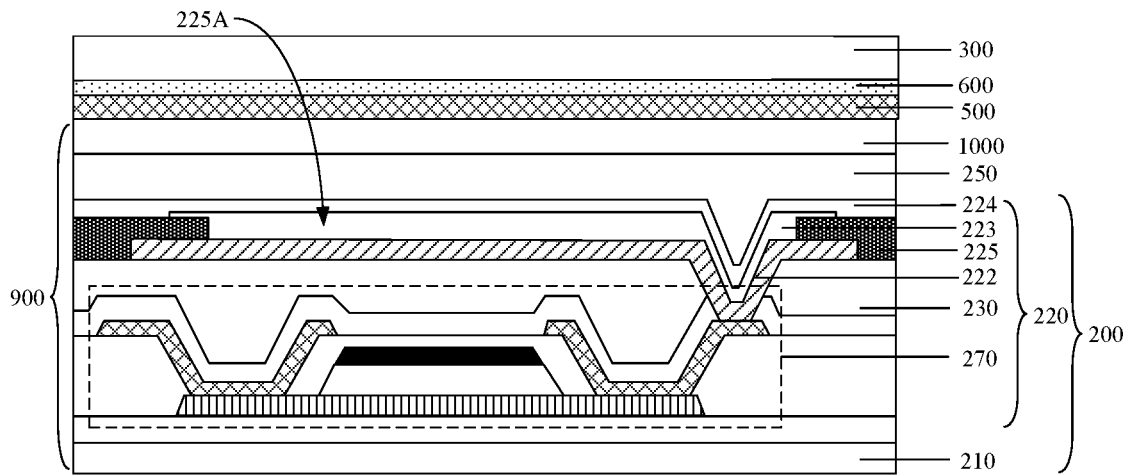
FIG. 12 is a cross-sectional view of a touch display device according to some embodiments.
Figure 13:
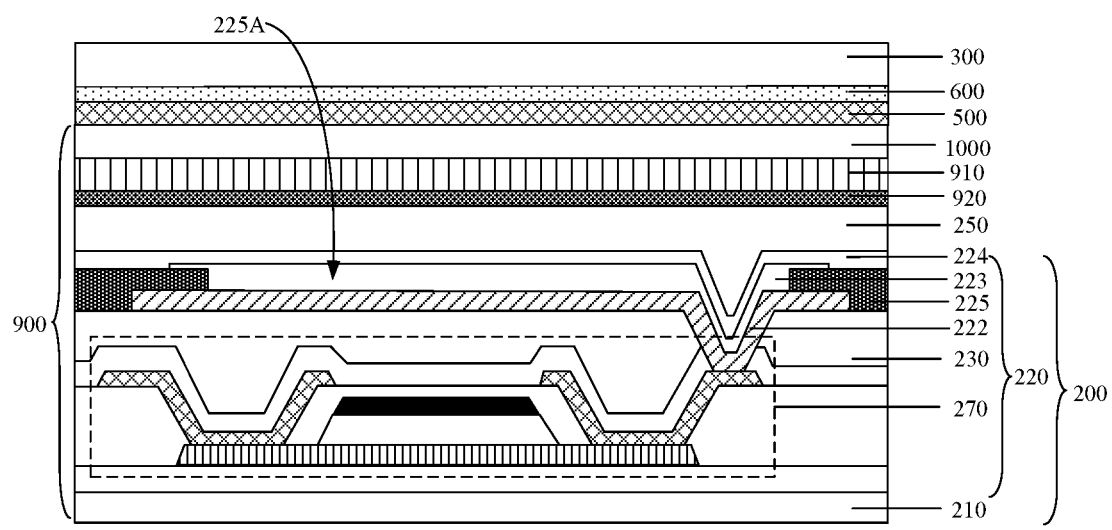
FIG. 13 is another sectional view of a touch display device according to some embodiments.

Based on this, as shown in FIG. 11, some embodiments of the disclosure provide a display panel 900, including a display substrate 200, an encapsulation layer 250 disposed on a light emitting side of the display substrate 200 and a touch structure 1000 disposed on a side of the encapsulation layer 250 facing away from the display substrate 200. The display panel 900 is applied to a touch display device, as shown in FIG. 12 and FIG. 13. The touch display device may be an electroluminescent display device or a photoluminescent display device. When the display device is an electroluminescent display device, the electroluminescent display device may be an organic light-emitting diode (OLED) or a quantum dot light emitting diode (QLED) or a liquid crystal display (LCD) or an electrophoretic display (EPD). When the touch display device is a photoluminescent display device, the photoluminescent display device may be a quantum dot photoluminescent display device.

In some embodiments of the disclosure, OLED display devices are taken as an example for illustration, however, it should not be considered to be limited to OLED display devices. In some embodiments, as shown in FIG. 12 and FIG. 13, a main structure of the touch display device includes a display panel 900, a touch structure 1000, an anti-reflection structure such as a polarizer 500, a first optically clear adhesive (OCA for short) layer 600 and a cover plate 300 disposed in sequence. In some embodiments, the anti-reflection structure may include a color filter and a black matrix. The position of the anti-reflection structure is not limited to the above description, and the anti-reflection structure may be disposed between the encapsulation layer and the display substrate, or may be disposed at other realizable positions.

The display panel 900 includes a display substrate 200 and an encapsulation layer 250 configured to encapsulate the display substrate 200. Herein, the encapsulation layer 250 may be an encapsulation film or an encapsulation substrate.

In some embodiments, as shown in FIG. 12, the touch structure 1000 of the display panel 900 is directly disposed on the encapsulation layer 250, such that the display substrate 200 can be regarded as a base substrate of the touch structure 1000, and such a structure is beneficial for realizing thinning of the display device.

In some embodiments, the encapsulation layer 250 may include a first inorganic encapsulation layer, a first organic encapsulation layer and a second inorganic encapsulation layer, and may also be a stacked structure consisting of at least one organic layer and at least one inorganic layer. In some embodiments, an anti-reflection structure may be formed in the encapsulation layer 250 for anti-reflection while further reducing the thickness of the display device.

In some other embodiments, as shown in FIG. 13, the touch structure 1000 of the display panel 900 is disposed on a base substrate 910, and the substrate base plate 910 is attached to the encapsulation layer 250 through a second optically clear adhesive layer 920. The material of the base substrate 910 may be, for example, polyethylene terephthalate (PET for short), polyimide (PI for short), cyclo olefin polymer (COP for short) or the like.

As shown in FIG. 10, FIG. 11, FIG. 12 and FIG. 13, each sub-pixel 211 of the above display substrate 200 includes a light emitting device and a driving circuit on the base substrate 210, and the driving circuit includes a plurality of thin film transistors 270. The light emitting device includes an anode 222, a light emitting layer 223 and a cathode 224. The anode 222 is electrically connected with a drain of the thin film transistor 270 serving as a driving transistor among a plurality of thin film transistors 270 of the driving circuit.

In some embodiments, when the anode 222 is electrically connected with a drain of the thin film transistor 270 serving as a driving transistor among the plurality of thin film transistors 270 of a driving circuit, the anode 222 is electrically connected with the drain through an adaptor electrode, and the adaptor electrode is located between a film layer where the drain is located and a film layer where the anode is located.

The display substrate 200 further includes a pixel defining layer 225, the pixel defining layer 225 includes a plurality of light outlets 225A, and one light emitting device is arranged corresponding to one light outlet 225A.

In some embodiments, the display functional layer 220 includes a light emitting layer 223. In some other embodiments, besides the light emitting layer 223, the display functional layer 220 further includes one or more of an electron transporting layer (ETL), an electron injection layer (EIL), a hole transporting Layer (HTL) and a hole injection layer (HIL).

As shown in FIG. 12 and FIG. 13, the display substrate 200 further includes at least one planarization layer 230 between the thin film transistor 270 and the anode 222. In some embodiments, the planarization layer 230 further includes at least one passivation layer.

When the touch display device is an electroluminescent display device, the touch display device may be a top emission-type display device, in this case, the anode 222 close to the base substrate 210 is opaque and the cathode 224 away from the base substrate 210 is transparent or translucent; the touch display device may also be a bottom emission-type display device, in this case, the anode 222 close to the base substrate 210 is transparent or translucent, and the cathode 224 away from the base substrate 210 is opaque; and the touch display device may also be a double-sided light emitting display device, and in this case, both the anode 222 close to the base substrate 210 and the cathode 224 away from the base substrate 210 are transparent or translucent.

With reference to FIG. 1A to FIG. 1D, FIG. 2A to FIG. 2D and FIG. 3A to FIG. 3D, embodiments of the disclosure provide a touch structure 1000, including:

a metal mesh 100, where the metal mesh 100 includes a plurality of metal wires 110;

where the metal mesh 100 includes a plurality of opening units 120, each opening unit 120 includes at least three openings 100A; and each opening 100A is enclosed by a plurality of metal wires 110, and the plurality of metal wires 110 enclosing each opening 100A have at least three different extending directions; at least one metal wire 110 separating openings in the opening unit 120 and each metal wire 100 forming an outer boundary of the opening unit 120 have different extending directions. Specifically, for example, in combination with FIG. 1B or FIG. 1C, the extending direction of each metal wire 110 forming the outer boundary of the opening unit 120 is horizontal or oblique, the plurality of metal wires 110 separating the openings 100A in the opening unit 120 include vertical metal wires 110, the vertical metal wire 110A and each metal wire 110 forming the outer boundary of the opening unit 120 have different extending directions; for another example, in combination with FIG. 2B or FIG. 2C, the extending direction of each metal wire 100 forming the outer boundary of the opening unit 120 is oblique, a plurality of metal wires 110 separating the openings 100A in the opening unit 120 include a vertical metal wire 110A, the vertical metal wire 110A and each metal wire 110 forming the outer boundary of the opening unit 120 have different directions; for still another example, in combination with FIG. 3B to FIG. 3D, the extending direction of each metal wire 100 forming the outer boundary of the opening unit 120 is horizontal or vertical, a plurality of metal wires 110 separating the openings 100A in the opening unit 120 include an oblique metal wire 110A, and the oblique metal wire 110A and each metal wire 110 forming the outer boundary of the opening unit 120 have different extending directions.

The touch area of the touch structure 1000 may be overlapped with the display area AA (active area) in the display substrate 200.

In embodiments of the disclosure, when a plurality of metal wires enclosing each opening have at least three different extending directions, and when at least one metal wire 110 separating the openings in the opening unit 120 and each metal wire 100 forming the outer boundary of the opening unit 120 have different extending directions, the incident light in one direction is reflected through the opening, and the resulting reflected light has more directions, and the light in each reflection direction is reduced to achieve an effect of quasi-scattering. The reflected brightness decreases, and the degree of reflection difference perceived by human eyes is reduced. In addition, the number of metal wires enclosing each opening is increased, at a boundary of touch electrodes (Tx and Rx), since the number and directions of the metal wires become more, more cuts can be selected to minimize the degree of reflection difference (touch mura) perceived by human eyes at the boundary.

Therefore, by setting the shape of the openings 100A in such a manner that the plurality of metal wires 110 enclosing each opening 100A have at least three different extending directions, at least one metal wire 110 separating the openings in the opening unit 120 and each metal wire 100 forming the outer boundary of the opening unit 120 have different extending directions, thereby increasing the extending direction of the metal wire 110 in the metal mesh 100, so that the direction of the reflected light of the metal mesh 100 as a whole is increased to achieve or approximate an effect of scattering light, thereby reducing or eliminating the phenomenon that the metal mesh 100 forms continuous reflected light in the same direction, reducing the degree of reflection difference perceived by human eyes, and improving the display effect.

In addition, when external light is directed towards a display panel, reflection of the metal mesh 100 of a touch structure 1000 close to a surface layer against the external light is the main reason causing Mura phenomenon (the brightness display is uneven, and various traces are shown). In some embodiments of the disclosure, through setting the shape of the above opening 100A in such a manner that the plurality of metal meshes 110 enclosing each opening 100A have at least three different extending directions, an effect of scattering reflected light is realized, and further the Mura phenomenon of the display panel 900 can be eliminated or reduced, and the display effect of the display panel 900 is improved.

In some embodiments, the number of metal wires 110 forming the outer boundary of the opening unit 120 is greater than the number of metal wires 110 in the opening unit 120. Specifically, for example, in combination with FIG. 1B and FIG. 1C, the metal wires 110 forming the outer boundary of the opening unit 120 include: two lines labeled a1, two lines labeled a2, two lines labeled a3, 6 metal wires 110 in total, the metal wires 110 in the opening unit 120 include: two lines labeled a4, two lines labeled a5, 4 metal wires 110 in total, and the number of metal wires 110 forming the outer boundary of the opening unit 120 is greater than the number of metal wires 110 inside the opening unit 120. For another example, in combination with FIG. 2B and FIG. 2C, the metal wires 110 forming the outer boundary of the opening unit 120 include: four lines labeled a6, two lines labeled a7, four lines labeled a8, and two lines labeled a9, 12 metal wires 110 in total. The metal wires 110 in the opening unit 120 include: 1 line labeled a10, 1 line labeled a11, 2 metal wires 110 in total, the number of metal wires 110 forming the outer boundary of the opening unit 120 is greater than the number of metal wires 110 in the opening unit 120. For still another example, in combination with FIG. 3B to FIG. 3D, the metal wires 110 forming the outer boundary of the opening unit 120 include: two lines labeled a12, two lines labeled a13, 4 metal wires 110 in total, the metal wires 110 in the opening unit 120 include: 1 line labeled a14, one or two lines labeled a15, at most 3 metal wires 110 in total, and the number of metal wires 110 forming the outer boundary of the opening unit 120 is greater than the number of metal wires 110 in the opening unit 120.

In some embodiments, the metal wires 110 forming the outer boundary of the opening unit 120 include at least one pair of metal wires 110 extending in the same direction. Specifically, for example, in combination with FIG. 1B and FIG. 1C, among the metal wires 110 forming the outer boundary of the opening unit 120, there are two lines labeled a1, two lines labeled a2 and two lines labeled a3, three pairs of metal wires 110 in total, each pair extending in the same direction. For another example, in combination with FIG. 2B and FIG. 2C, among the metal wires 110 forming the outer boundary of the opening unit 120, there are four lines labeled a6, two lines labeled a7, four lines labeled a8, two lines labeled a9, six pairs of metal wires 110 in total, each pair extending in the same direction. For still another example, in combination with FIG. 3B to FIG. 3D, among the metal wires 110 forming the outer boundary of the opening unit 120, there are two lines labeled a12, two lines labeled a13, two pairs of metal wires 110 in total, each pair extending in the same direction.

In some embodiments, as shown in FIG. 1A to FIG. 1D, the outer boundary of the opening unit 120 is a parallelepiped. In the embodiments of the disclosure, the outer boundary of the opening unit 120 is a parallelepiped, which is advantageous for a plurality of opening units 120 to be combined with each other without gaps to form a tightly arranged structure and also to form a plurality of tightly arranged openings 100A. Since the openings 100A are usually in one-to-one correspondence with the sub-pixels, the sub-pixels may also be tightly arranged, and more sub-pixels may be arranged in a limited area, thereby improving the resolution of the display device.

Figure 1B:
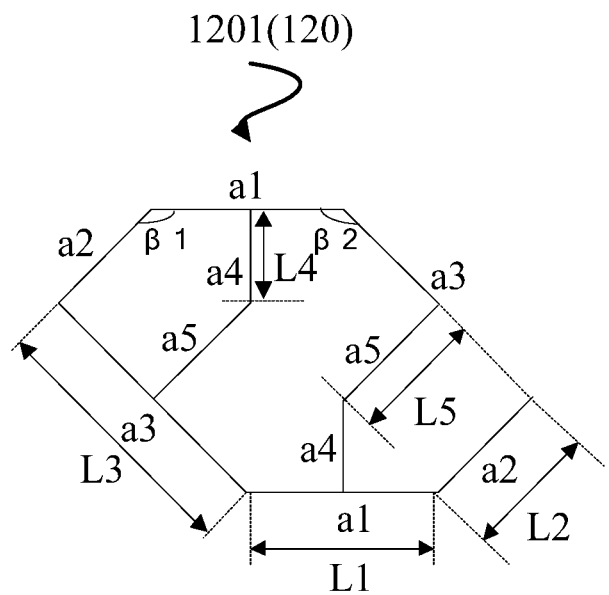
FIG. 1B is an enlarged view of an opening unit in FIG. 1A.
Figure 1C:
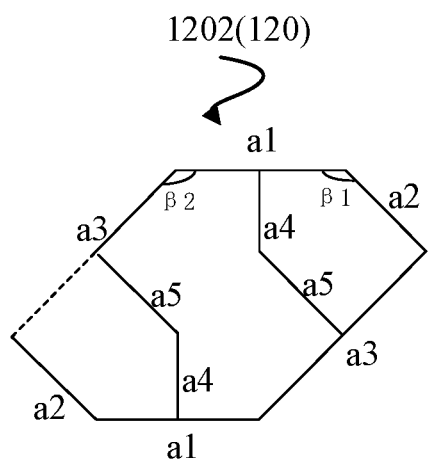
FIG. 1C is an enlarged view diagram of another opening unit in FIG. 1A.

In some embodiments, as shown in FIG. 1B and FIG. 1C, the metal wires 110 forming the outer boundary of the opening unit 120 include: two first metal wires a1 arranged oppositely and in parallel, two second metal wires a2 arranged oppositely and in parallel, and two third metal wires a3 arranged oppositely and in parallel. One of the second metal wires a2 connects one first metal wire a1 and one third metal wire a3, and the other second metal wire a2 connects the other first metal wire a1 and the other third metal wire a3. Specifically, for example, in FIG. 1B, the second metal wire a2 on the left connects the upper first metal wire a1 and the third metal wire a3 on the lower left side, and the second metal wire a2 on the right connects the lower first metal wire a1 and the third metal wire a3 on the upper right side.

In some embodiments, as shown in FIG. 1B and FIG. 1C, the length L3 of the third metal wire a3 is greater than the length L1 of the first metal wire a1, and the length L1 of the first metal wire a1 is greater than the length L2 of the second metal wire a2.

In some embodiments, as shown in FIG. 1B and FIG. 1C, the second metal wire a2 is perpendicular to the third metal wire a3 connected with the second metal wire a2.

In some embodiments, as shown in FIG. 1B and FIG. 1C, in the opening unit 120, the first included angle $\beta1$ formed between the first metal wire a1 and the connected second metal wire a2 is the same as the second included angle $\beta2$ formed between the first metal wire a1 and the connected third metal wire a3.

In some embodiments, as shown in FIG. 1B and FIG. 1C, in the opening unit 120, the first included angle β1 formed between the first metal wire a1 and the connected second metal wire a2 is in a range of 120° to 150°. In some embodiments, the included angle β1 formed between the first metal wire a1 and the connected second metal wire a2 is 135°. In an embodiment of the disclosure, in the opening unit 120, the included angle β1 formed between the first metal wire a1 and the connected second metal wire a2 is in a range of 120° to 150°, so that during specific manufacturing, the angle is relatively easy to manufacture, which is beneficial for simplifying the manufacturing process of the touch structure.

Figure 5:
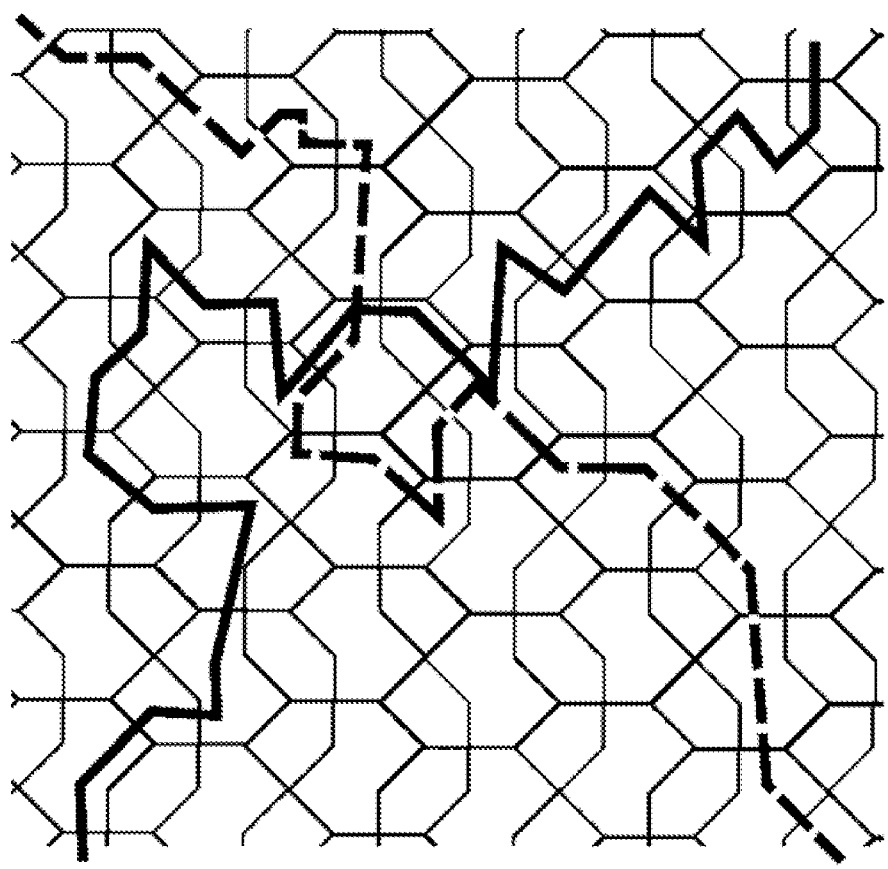
FIG. 5 is a schematic diagram of a boundary of the touch electrode.

In addition, when the included angle β1 formed between the first metal wire a1 and the connected second metal wire a2 is 135°, if the direction of the first metal wire a1 is set to the direction of 0°, then the second metal wire a2 is arranged in an oblique direction of 45°, the fourth metal wire a4 is arranged in a vertical direction of 90°, and the third metal wire a3 is arranged in an oblique direction of 135°. This alternative arrangement ensures to be beneficial to the bending design at the boundary of the touch electrodes (Tx and Rx) (as shown by the dotted thick line and the solid thick line in FIG. 5), when the boundary of Tx and Rx is 45° and 135° diagonally, it is more conducive to the matching design of the opening design at the non-boundary, to avoid dark-state reflection MURA by the opening design, and reduce the degree of reflection difference perceived by human eyes.

In some embodiments, as shown in FIG. 1B and FIG. 1C, the opening unit 120 includes: two fourth metal wires a4 respectively extending from a midpoint of the first metal wire a1 and perpendicular to the first metal wire a1, and two fifth metal wires a5 extending along a direction parallel to the second metal wire a2 and respectively connecting the other end of the fourth metal wire a4 and a midpoint of the third metal wire a3. In this way, the opening unit 120 may have two pentagonal openings 100A and one octagonal opening 100A with different areas, so that when three sub-pixels are arranged correspondingly, the areas of different sub-pixels are different. For example, the octagonal opening 100A is provided with a blue sub-pixel, and the two pentagonal openings 100A are respectively provided with a red sub-pixel and a green sub-pixel. Due to the limitation of the material used for the blue sub-pixel, the service life of the blue sub-pixel is relatively short, and the light emitting brightness is low, by setting a larger area of the blue sub-pixel, it is beneficial for balancing the brightness and service life of sub-pixels with different light emitting colors of the display device. In addition, human eyes have different sensitivities to colors, and the sensitivities of human eyes to colors are specifically as follows: green>red>blue. For this reason, the area of the blue sub-pixel B is greater than the area of the red sub-pixel R, and the area of the red sub-pixel R is greater than the area of the green sub-pixel G, thereby realizing perception balance of human eyes on light of various colors, reducing the redundancy of sub-pixels, and improving the aperture ratio and resolution.

In some embodiments, as shown in FIG. 1B and FIG. 1C, the length of the fourth metal wire a4 is a half of the length L1 of the first metal wire a1; and the length of the fifth metal wire a5 is equal to the length L2 of the second metal wire a2.

Figure 2A:
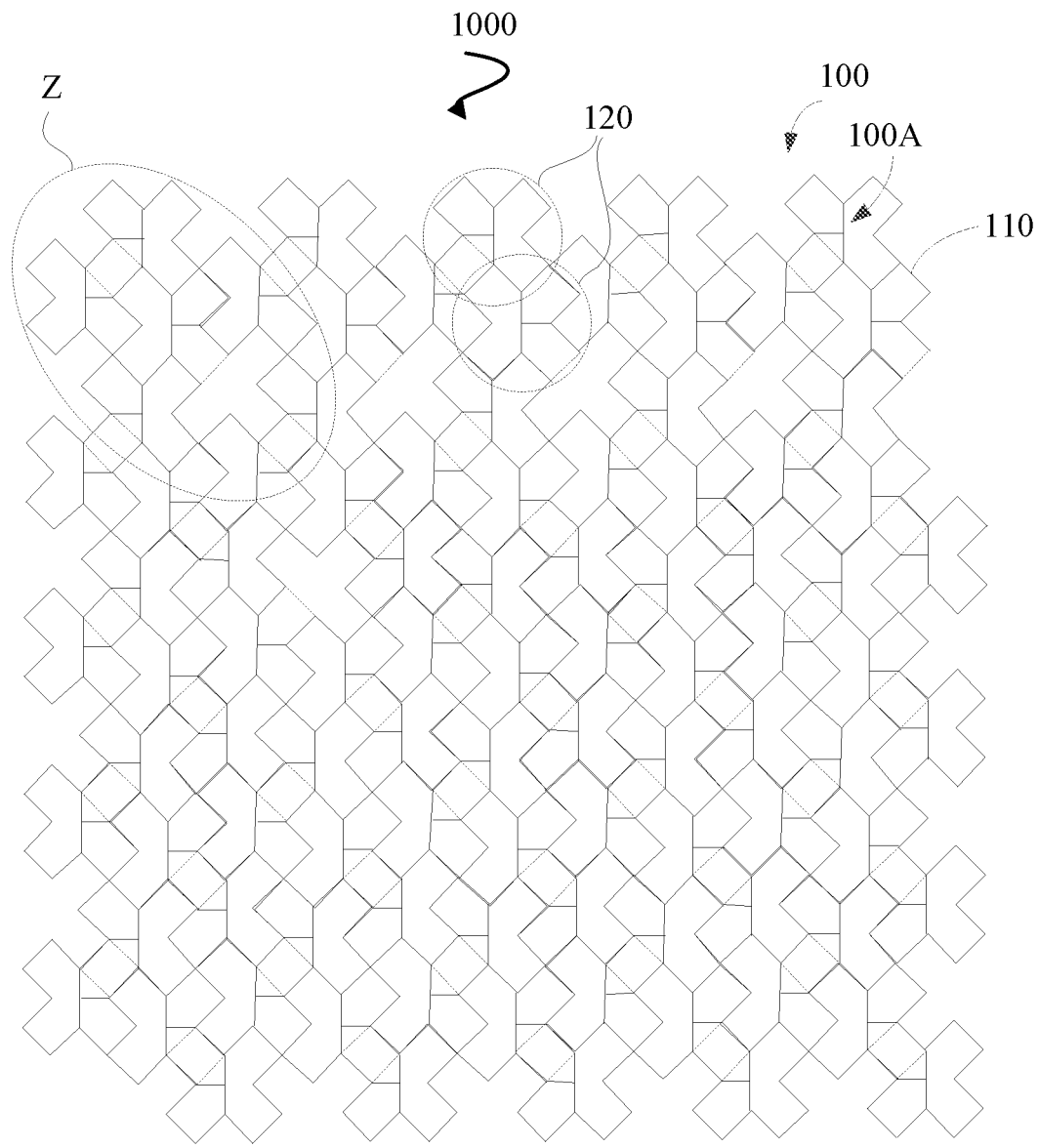
FIG. 2A is a second schematic diagram of a touch structure provided by an embodiment of the disclosure.
Figure 2B:
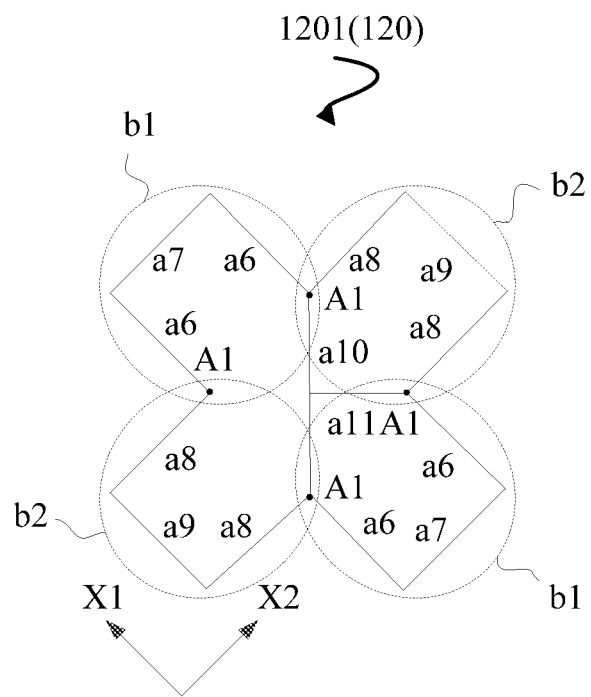
FIG. 2B is an enlarged view of an opening unit in FIG. 2A.
Figure 2C:
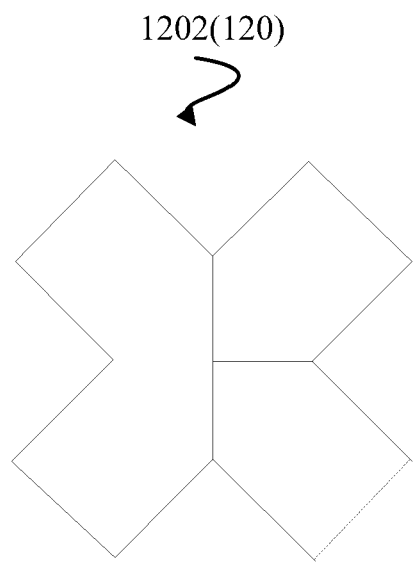
FIG. 2C is an enlarged view of another opening unit in FIG. 2A.

In some embodiments, as shown in FIG. 2B and FIG. 2C, the outer boundary of the opening unit 120 is cross-shaped. In an embodiment of the disclosure, the outer boundary of the opening unit 120 is cross-shaped, which is advantageous for a plurality of opening units 120 to be combined with each other without gaps to form a tightly arranged structure and also to form a plurality of tightly arranged openings 100A. Since the openings 100A are usually in one-to-one correspondence with the sub-pixels, the sub-pixels may also be tightly arranged, and more sub-pixels may be arranged in a limited area, thereby improving the resolution of the display device.

In some embodiments, as shown in FIG. 2B and FIG. 2C, the opening unit 120 includes: two first convex parts b1 opposed with one extending along a first direction X1 and the other one extending along a direction opposite to the first direction X1, and two second convex parts b2 opposed with one extending along a first direction X2 and the other one extending along a direction opposite to the first direction X2; and the first direction X1 is perpendicular to the second direction X2.

In some embodiments, the first direction X1 may be a 45° direction relative to a vertical direction of arrangement of the repeating units Z, and the second direction X2 may be a 45° direction relative to a row direction of arrangement of the repeating units Z.

In some embodiments, as shown in FIG. 2B and FIG. 2C, the outer boundary of the first convex part b1 includes: two sixth metal wires a6 extending along the first direction X1, and a seventh metal wire a7 connecting two sixth metal wires a6 and extending along the second direction X2; the outer boundary of the second convex part b2 includes: two eighth metal wires a8 extending along the second direction X2, and a ninth metal wire a9 connecting two eighth metal wires a8 and extending along the first direction X1; and the sixth metal wire a6 of the first convex part b1 is intersected with the eighth metal wire a8 of the adjacent second convex part b2 at the first node A1.

In some embodiments, as shown in FIG. 2B and FIG. 2C, the length of the sixth metal wire a6 is greater than the length of the seventh metal wire a7, and the length of the eighth metal wire s8 is greater than the length of the ninth metal wire a9.

In some embodiments, as shown in FIG. 2B and FIG. 2C, the opening unit 120 includes: a tenth metal wire a10 connecting two non-adjacent first nodes A1, and an eleventh metal wire a11 connecting a midpoint of the tenth metal wire a10 and the first node A1 at one side of the tenth metal wire a10.

In some embodiments, with reference to FIG. 1A to FIG. 1D and FIG. 2A to FIG. 2D, the opening unit 120 includes: a first sub-opening unit 1201 and a second sub-opening unit 1202, where the first sub-opening unit 1201 and the second sub-opening unit 1202 each is of a mirror symmetrical structure. The two first sub-opening units 1201 and the two sub-opening units 1202 form a repeating unit Z. In the repeating unit Z, the two first sub-opening units 1201 are connected by reusing one opening to form a first combination; and the two second sub-opening units 1202 are connected by reusing one opening to form a second combination; the first combination is reused with the metal wires 110 of the two different second sub-opening units 1202 respectively through the two adjacent metal wires on the outer boundary to form the repeating unit Z.

Figure 1D:
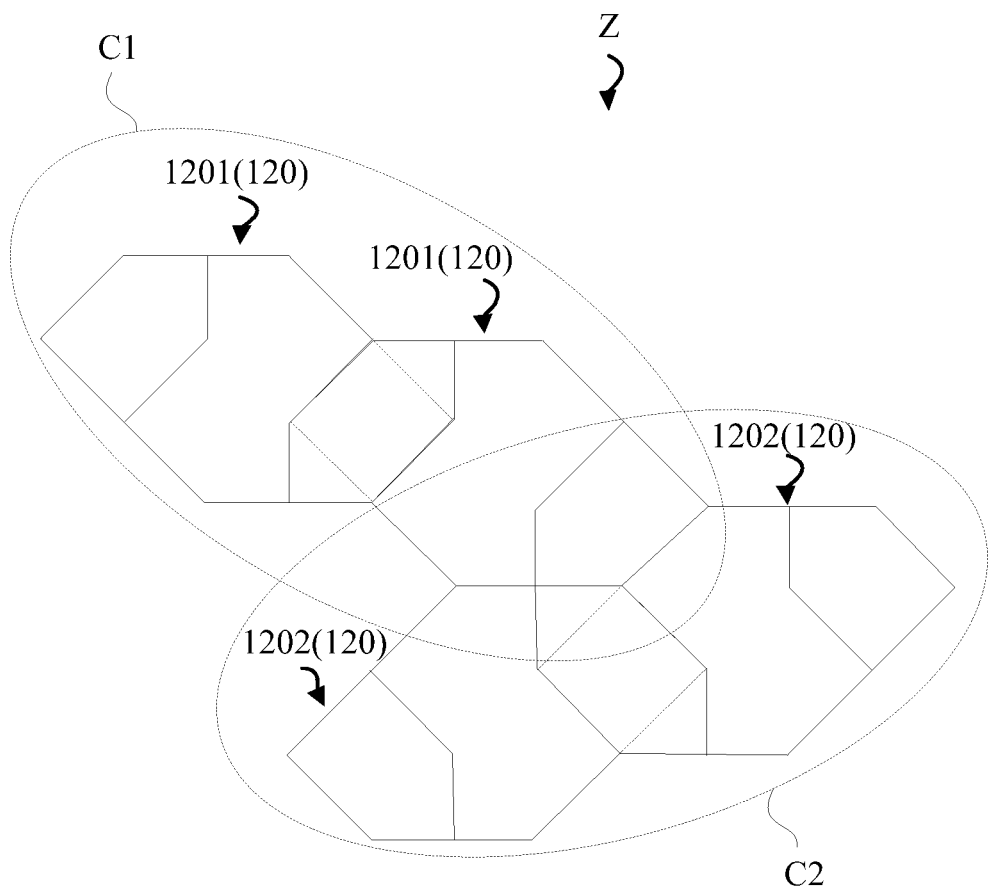
FIG. 1D is an enlarged view of a repeating unit in FIG. 1A.
Figure 1E:
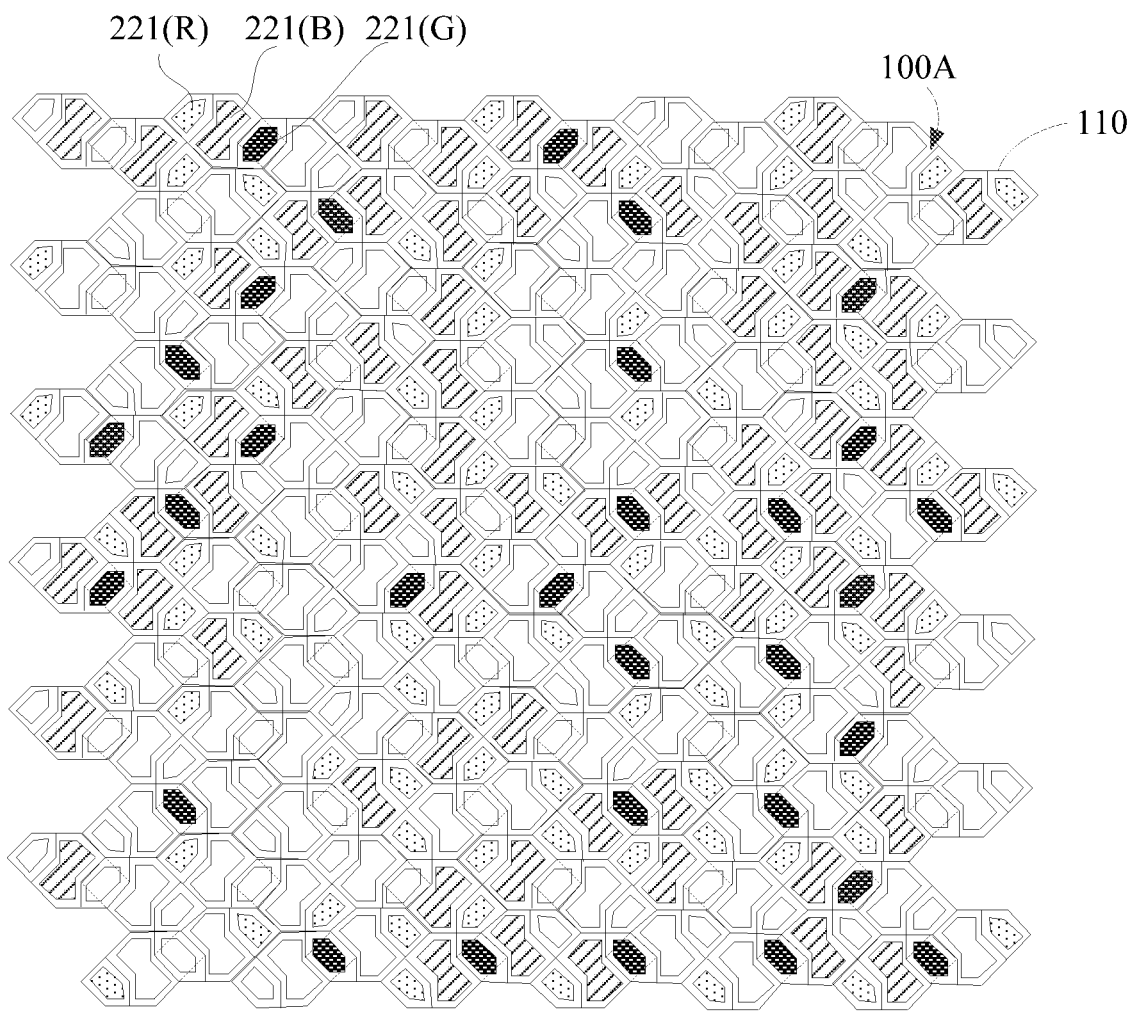
FIG. 1E is a schematic diagram of a touch structure in FIG. 1A with sub-pixels arranged.
Figure 2D:
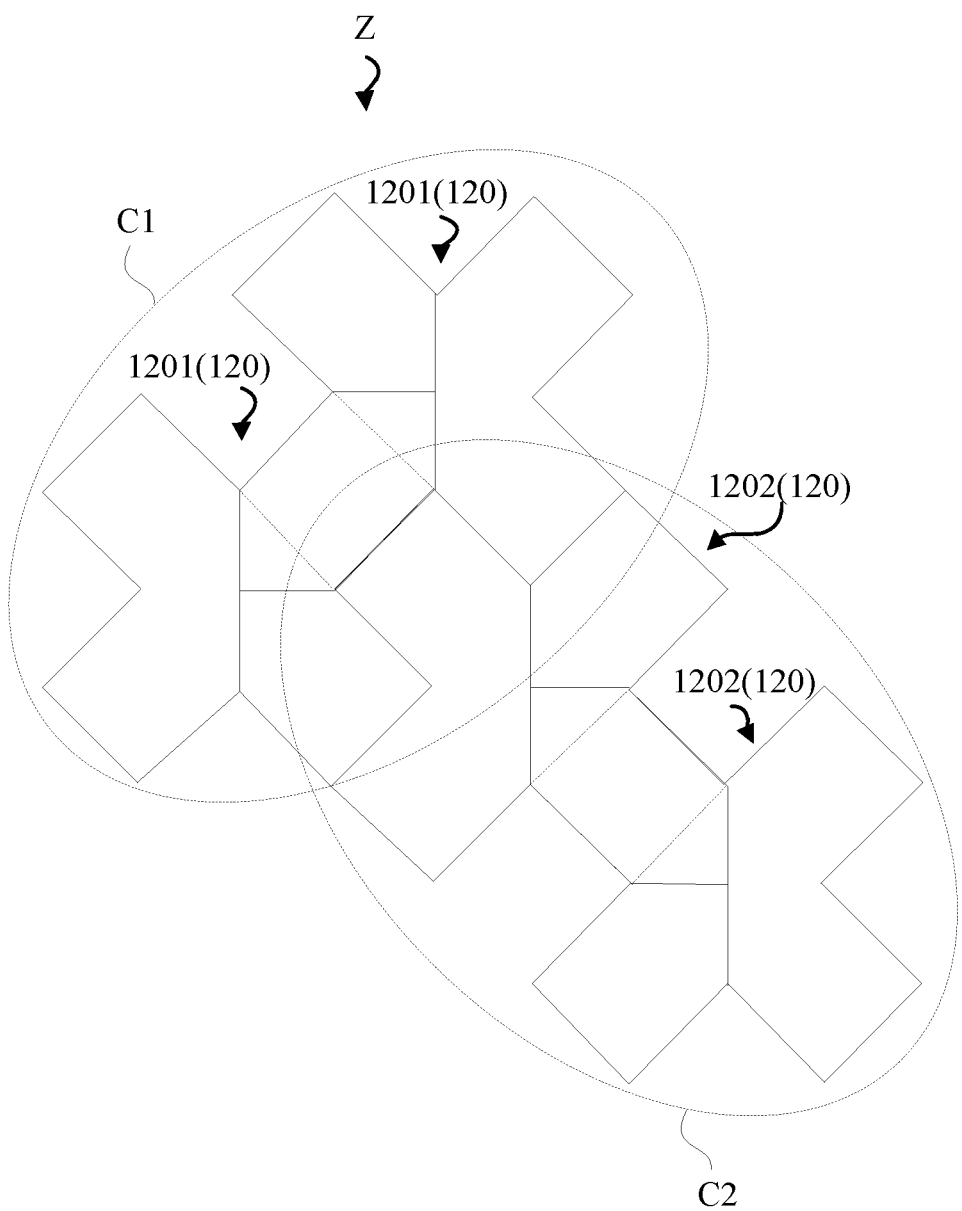
FIG. 2D is an enlarged view of a repeating unit in FIG. 2A.
Figure 2E:
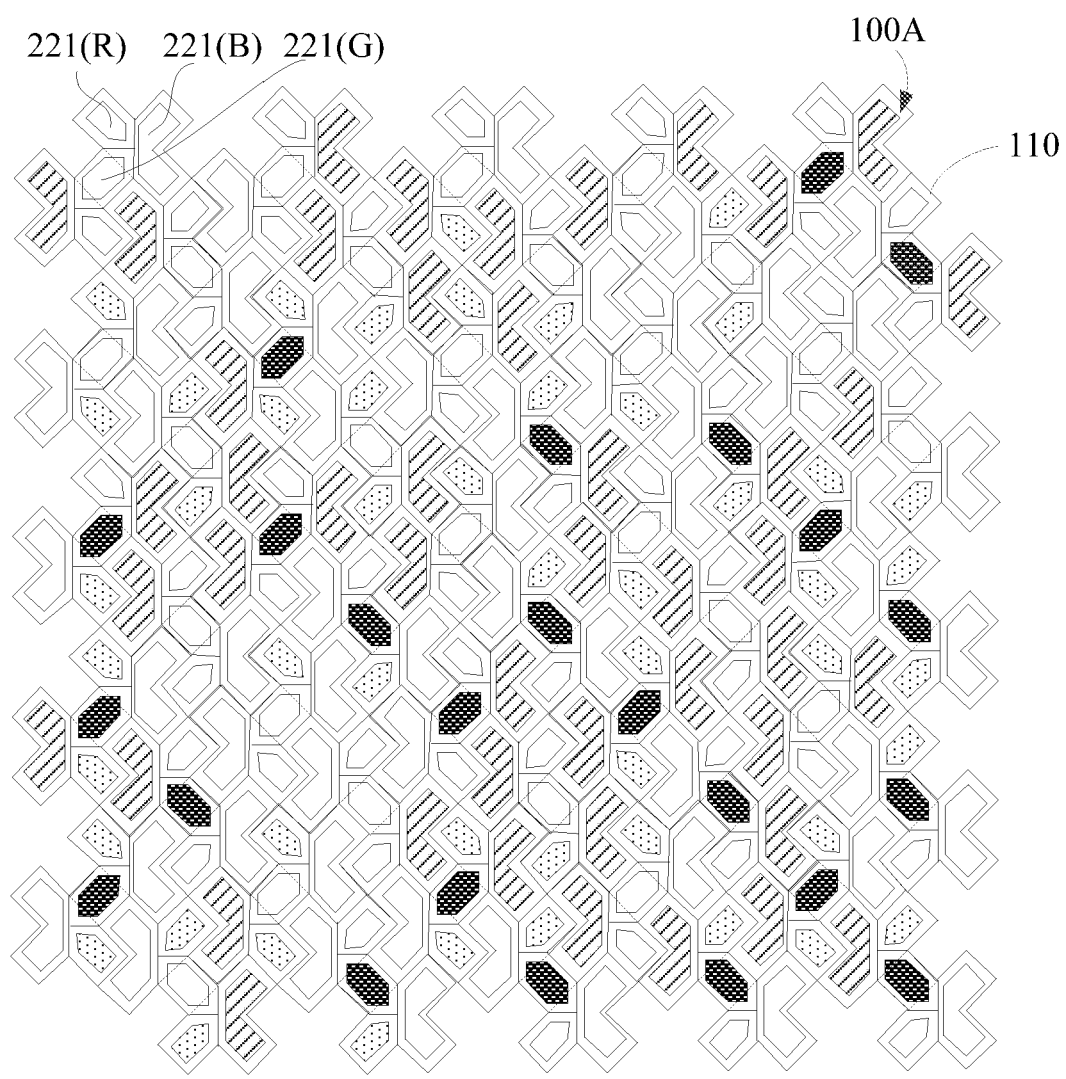
FIG. 2E is a schematic diagram of a touch structure in FIG. 2A with sub-pixels arranged.

In some embodiments, in the repeating unit Z, the metal wire inside the reused opening may not be arranged, such as the position as shown by the dotted line in the opening in FIG. 1D or FIG. 2D.

In some embodiments, with reference to FIG. 3A to FIG. 3D, the outer boundary of the opening unit 120 is a rectangle. In an embodiment of the disclosure, the outer boundary of the opening unit 120 is a rectangle, which is advantageous for a plurality of opening units 120 to be combined with each other without gaps to form a tightly arranged structure and also to form a plurality of tightly arranged openings 100A. Since the openings 100A are usually in one-to-one correspondence with the sub-pixels, the sub-pixels may also be tightly arranged, and more sub-pixels may be arranged in a limited area, thereby improving the resolution of the display device.

Figure 3A:
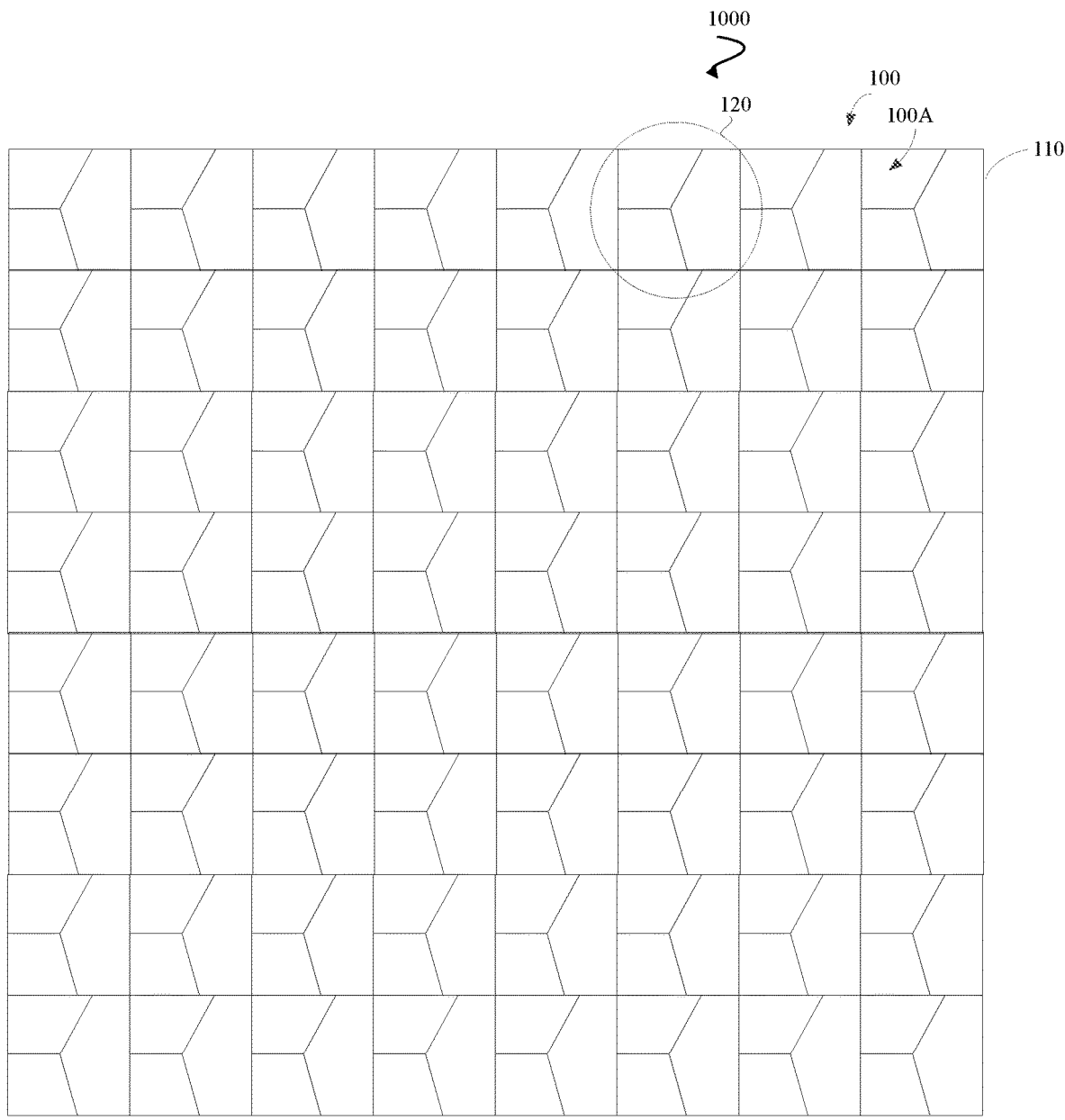
FIG. 3A is a third schematic diagram of a touch structure provided by an embodiment of the disclosure.
Figure 3B:
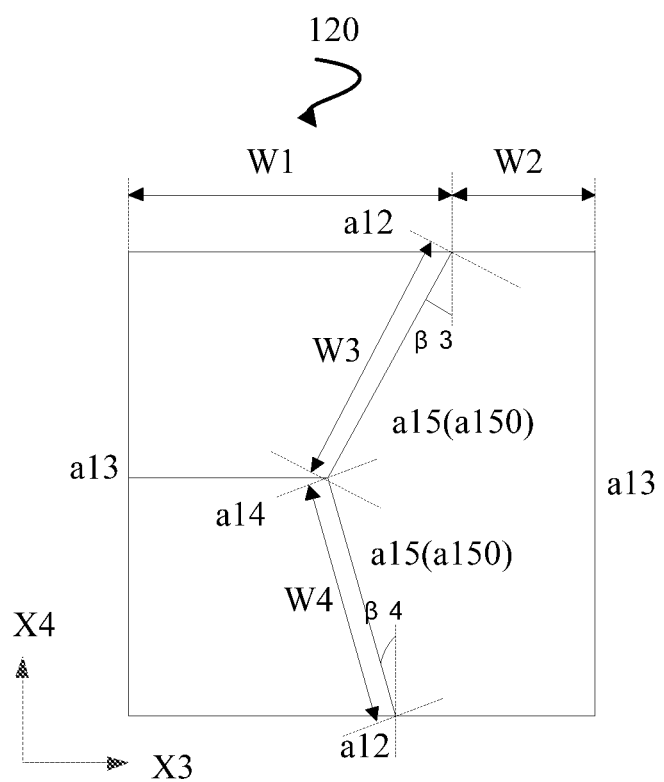
FIG. 3B is an enlarged view of an opening units in FIG. 3A.
Figure 3C:
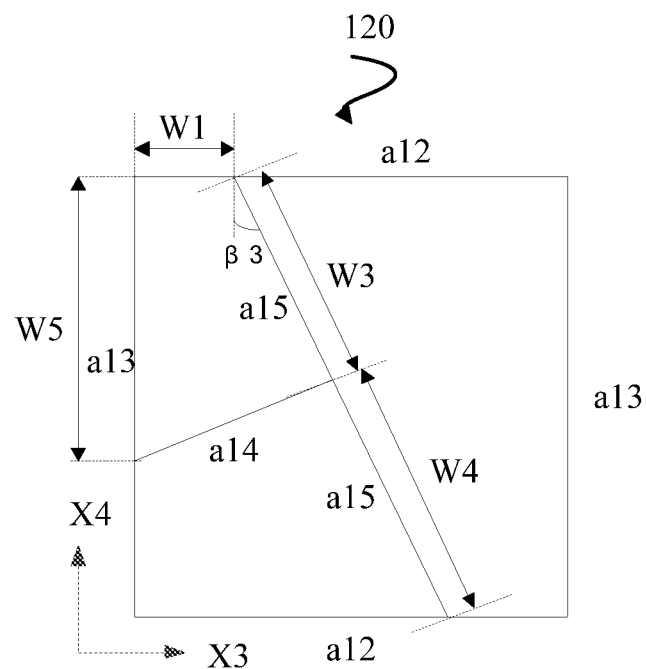
FIG. 3C is an enlarged view of another opening unit in FIG. 3A.
Figure 3D:
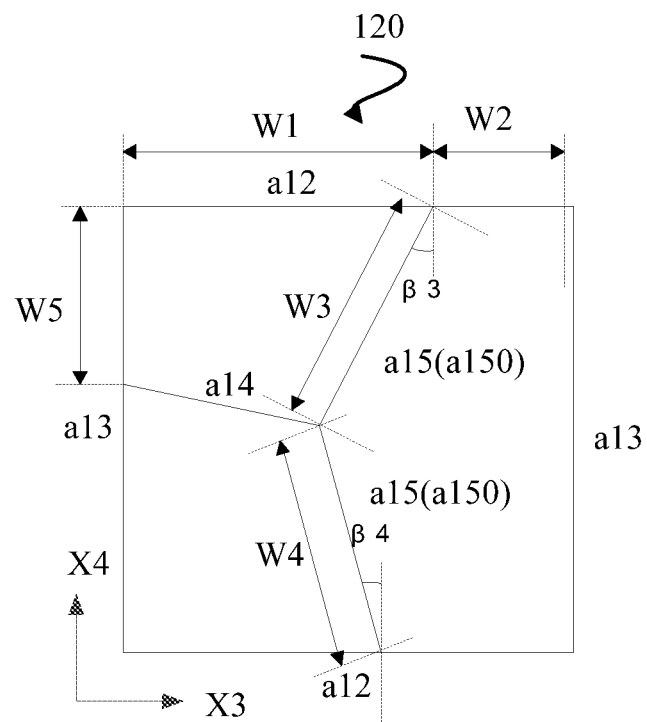
FIG. 3D is an enlarged view of another opening unit in FIG. 3A.
Figure 3E:
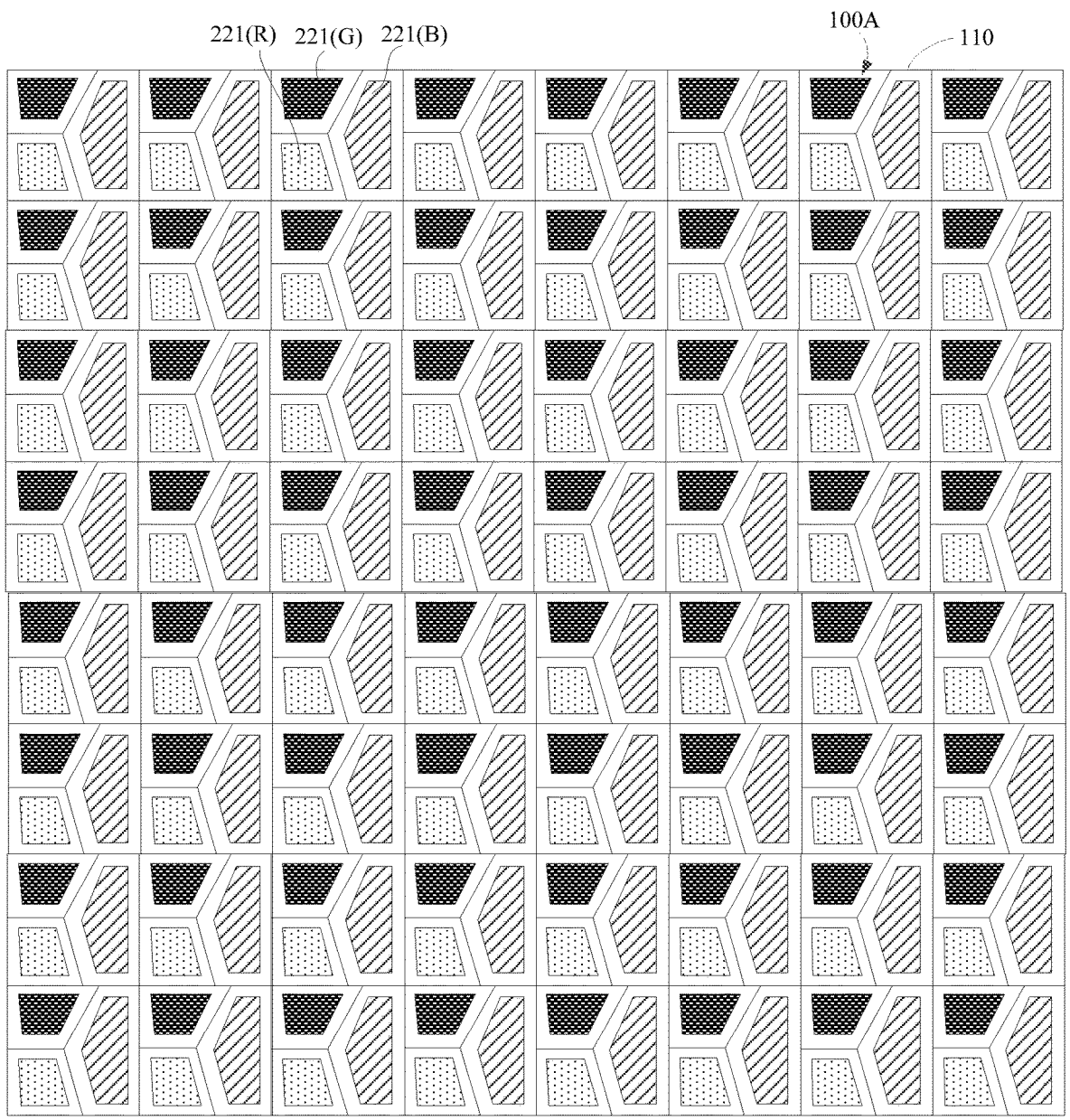
FIG. 3E is a schematic diagram of a touch structure in FIG. 3A with sub-pixels arranged.
Figure 3F:
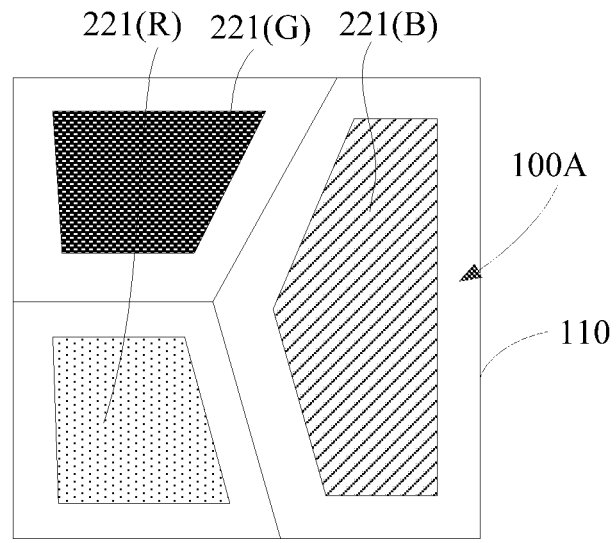
FIG. 3F is an enlarged view of an opening unit in FIG. 3E.
Figure 3G:
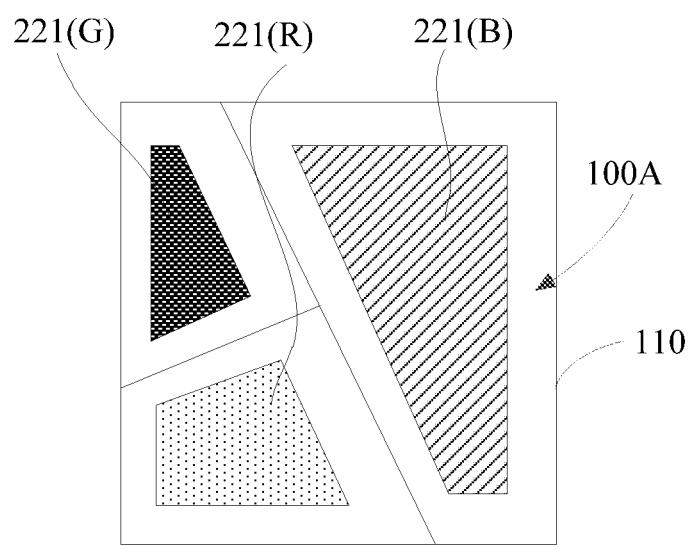
FIG. 3G is an enlarged view of another opening unit in FIG. 3E.
Figure 3H:
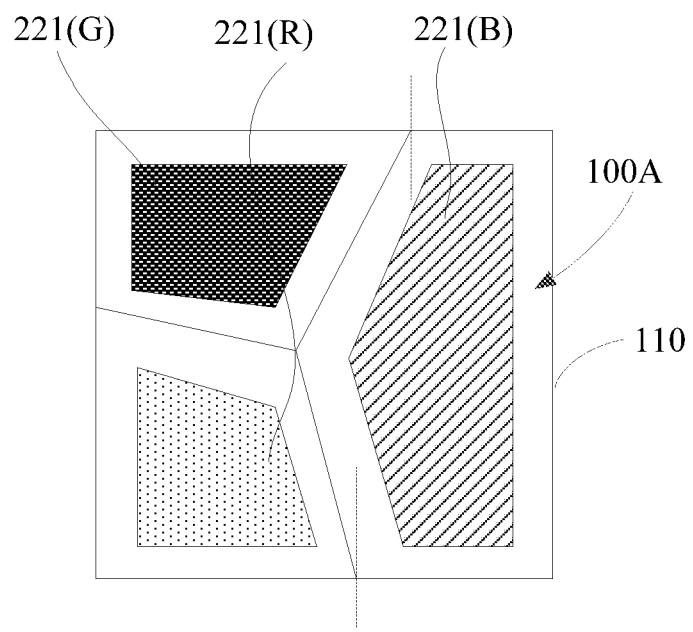
FIG. 3H is an enlarged view of another opening unit in FIG. 3E.

In some embodiments, with reference to FIG. 3B to FIG. 3D, the metal wires 110 forming the outer boundary of the opening unit 120 include: two twelfth metal wires a12 extending along a third direction X3 and arranged oppositely, and two thirteenth metal wires a13 extending along the third direction X3 and arranged oppositely, one of the thirteenth metal wires a13 is respectively connected with one end of the two twelfth metal wires a12, and the other of the thirteenth metal wires a13 is respectively connected with the other end of the two twelfth metal wires a12. Specifically, for example, the thirteenth metal wire a13 on the left is respectively connected to the left ends of the upper and lower twelfth metal wires a12, and the thirteenth metal wire a13 on the right is respectively connected to the right ends of the upper and lower twelfth metal wires a12. Inside the opening unit 120, there are the fourteenth metal wire a14 extending inwards from a point on the thirteenth metal wire a13, and a fifteenth metal wire a15 connecting two opposite twelfth metal wires a12, and the other end of the fourteenth metal wire a14 is connected to a point on the fifteenth metal wire a15; and at least one of the fourteenth metal wire a14 and the fifteenth metal wire a15 is not parallel to either the third direction or the fourth direction.

In some embodiments, with reference to FIG. 3C, the fifteenth metal wire a15 is a linear segment.

In some embodiments, with reference to FIG. 3B and FIG. 3D, the fifteenth metal wire a15 includes two sub-metal wires a150 extending in different directions.

In some embodiments, as shown in FIG. 3B and FIG. 3D, the included angle formed between one sub-metal wire a150) and the fourth direction X4 is a third included angle $\beta 3$, and the included angle formed between the other sub-metal wire and the fourth direction is the fourth included angle $\beta 4$, and the third included angle $\beta 3$ is not equal to the fourth included angle $\beta 4$. In this way, two sub-metal wires extending in different directions are formed, which is beneficial to increasing the number of directions of reflected light.

In some embodiments, with reference to FIG. 3B and FIG. 3D, the third included angle $\beta 3$ is in a range of 10° to 45°, and the fourth included angle $\beta 4$ is in a range of 10° to 45°.

In some embodiments, in combination with that is shown in FIG. 3B to FIG. 3D, through adjusting the lengths of W1 to W5, a difference in the aperture ratios of the three sub-pixels R, G, and B may be realized, thereby ensuring better display quality.

In some embodiments, the material of the metal wire 110 includes at least one of copper (Cu), argentum (Ag), nano carbon or graphene. With the material of the metal wire 110 including argentums as an example, argentum may refer to elemental argentum, may also refer to nano argentum or other structural forms of argentum; in addition, the material of the metal wire 110 may also be a compound including an argentum element, which is not limited herein.

With the material of the metal wire 110 including copper and nano carbon as an example, copper may refer to elemental copper, may also refer to nano copper or other structural forms of copper; nano carbon may refer to carbon nanotubes or carbon nanofibers, and may also refer to carbon nanospheres or other structural forms. The material of the metal wire 110 may include a mixture of any of the above copper forms and any of the above nano carbon forms.

Figure 6:
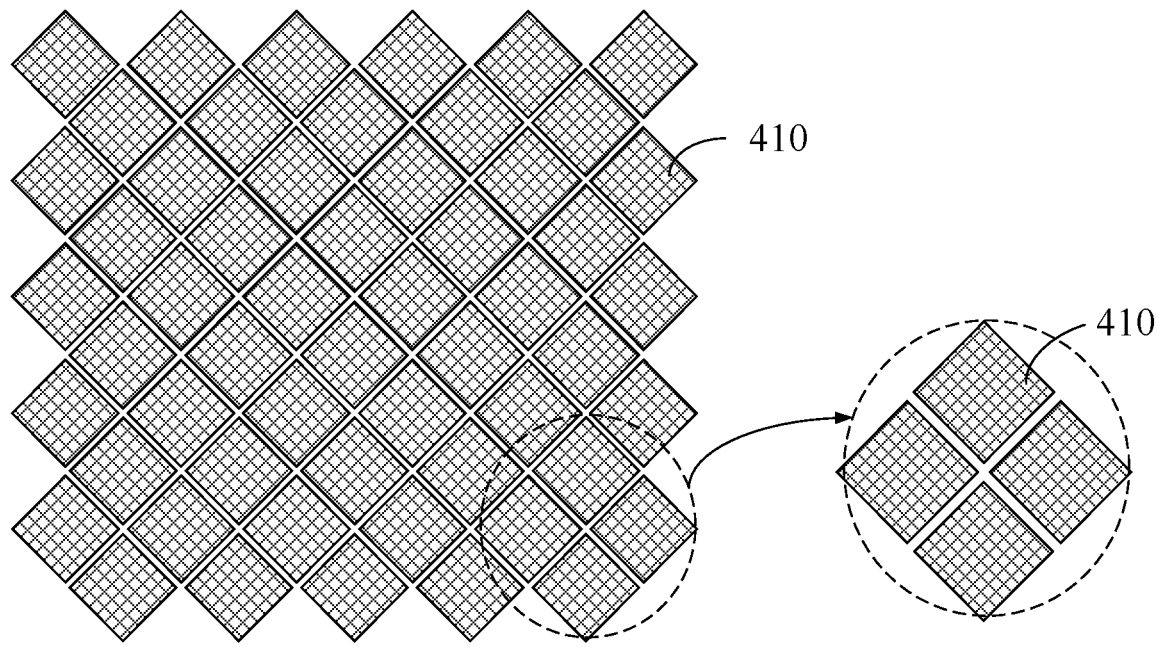
FIG. 6 is a top view of a touch electrode according to some embodiments.

In some embodiments, as shown in FIG. 6, the touch structure may include a plurality of touch electrodes 410, each touch electrode 410 includes a metal mesh, and the plurality of touch electrodes are configured to be independently connected to the touch chip.

A plurality of touch electrodes 410 are insulated from each other, and the plurality of touch electrodes 410 are arranged in the display area. The shapes of the plurality of touch electrodes 410 may be identical, and the shape of the touch electrodes 410 may be rhombic or approximately rhombic. Here "approximately rhombic" means that the shape of the touch electrode 410 is rhombic as a whole but is not limited to a standard rhombus. For example, boundaries of the touch electrodes 410 may be a non-linear shape (e.g., zigzag).

In addition, the shape of the touch electrode 410 is not limited to a rhombic shape or an approximate rhombic shape, but may also be a rectangular shape, a strip shape or the like.

The touch electrode 410 including a metal mesh means that each touch electrode adopts a metal mesh structure. Compared with the adoption of an ITO (indium tin oxide) to form a planar electrode as a touch electrode 410, the touch electrode 410 of the metal mesh structure has small resistance and high sensitivity, and can improve the touch sensitivity of the touch display panel. Moreover, the touch electrodes 410 with a metal mesh structure have high mechanical strength, and can reduce weight of the touch display panel. When the touch display panel is applied to a display device, thinning of the display device can be realized.

A plurality of touch electrodes 410 including a metal mesh structure may be arranged on the same metal layer, i.e., an FSLOC structure, which facilitates thinning of the display device.

Each touch electrode 410 is electrically connected to a touch chip independently, and the touch chip provides voltage to the touch electrode 410, so that the touch electrodes 410 can independently form capacitance with the ground. Subsequently; the touch points in the display area are determined by sensing changes of a plurality of capacitors.

Here, the metal wire of the metal mesh in the touch electrode 410 may be disposed corresponding to a gap between the light emitting areas 221A of the plurality of sub-pixels 221 in the display area, thereby preventing the metal mesh from shielding emission of light, and ensuring the light emitting efficiency of the display device.

Figure 7:
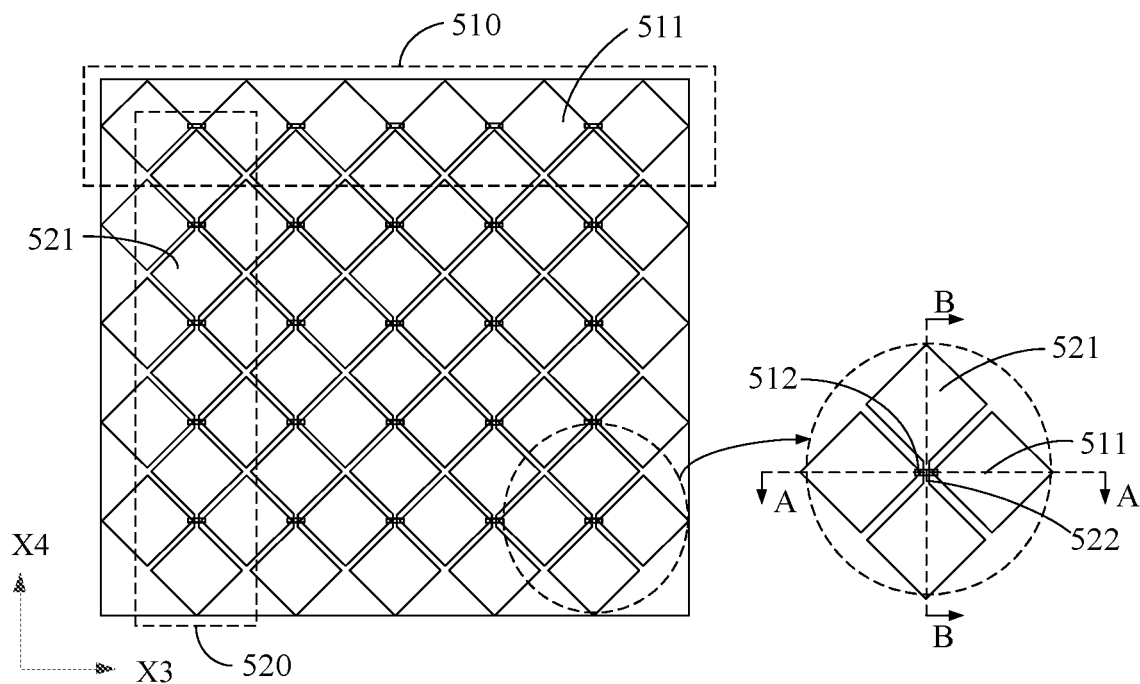
FIG. 7 is a top view of a driving electrode and a sensing electrode according to some embodiments.

In some embodiments, as shown in FIG. 7, the touch structure may include a plurality of driving units 510 and a plurality of sensing units 520 insulated from each other; each driving unit 510 includes a plurality of driving electrodes 511 arranged in a line along a third direction X3 and a first connecting part 512 electrically connecting two adjacent driving electrodes 511; each sensing unit 520 includes a plurality of sensing electrodes 521 arranged in a line along a fourth direction X4 and a second connecting part 522 electrically connecting two adjacent sensing electrodes 521. The third direction X3 and the fourth direction X4 are intersected with each other. Specifically, the third direction X3 may be the row direction of arrangement of the driving electrodes 511, and the third direction X3 may be the column direction of arrangement of the driving electrodes 511.

Figure 8:
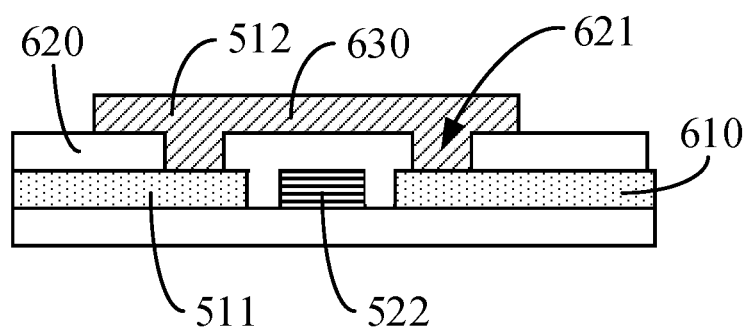
FIG. 8 is a cross-sectional view of a touch structure according to some embodiments along line AA' in FIG. 7.
Figure 9:
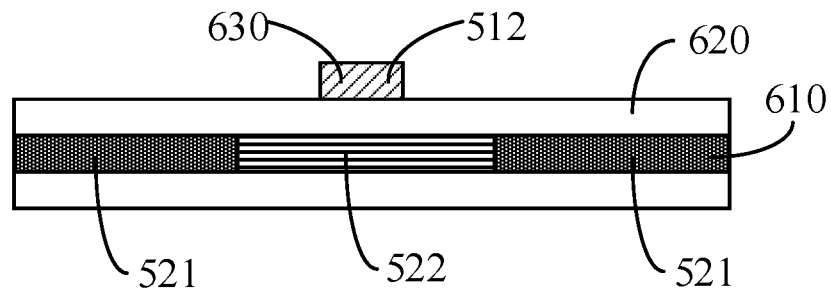
FIG. 9 is a cross-sectional view of a touch structure according to some embodiments along line BB' in FIG. 7.

As shown in FIG. 8 and FIG. 9, the touch structure includes a first metal layer 610, an insulating layer 620 and a second metal layer 630 which are stacked in sequence, and a plurality of via holes 621 are arranged in the insulating layer 620.

In some embodiments, the driving electrode 511, the first connecting part 512 and the sensing electrode 521 are disposed in one of the first metal layer 610 and the second metal layer 630, and the second connecting part 522 is disposed in the other of the first metal layer 610 and the second metal layer 630, and the second connecting part 522 electrically connects two adjacent sensing electrodes 521 through via holes 621.

In some embodiments, the driving electrode 511, the second connecting part 522 and the sensing electrode 521 are disposed in one of the first metal layer 610 and the second metal layer 630, and the first connecting part 512 is disposed in the other of the first metal layer 610 and the second metal layer 630, and the first connecting part 512 electrically connects two adjacent driving electrodes 511 through via holes 621.

In some embodiments, the driving electrode 511, the sensing electrode 521, the first connecting part 512 and the second connecting part 522 include metal meshes. The design described in the above embodiments is adopted for the shape of the opening and related arrangement of the metal mesh, such that the number of directions of reflected light of the touch structure 1000 can be increased, thereby reducing the amount of reflected light in each direction of reflected light, and achieving an effect of quasi-scattering, therefore, human eyes cannot perceive reflected light, thereby eliminating or reducing the degree of reflection difference perceived by human eyes, and improving the display effect.

As shown in FIG. 7, the third direction X3 is intersected with the fourth direction X4, for example, the third direction X3 may be perpendicular to the fourth direction X4. For example, the third direction X3 may be a horizontal direction of the touch display device, and the fourth direction X4 may be a longitudinal direction of the touch display device; or the third direction X3 may be a row direction of pixel arrangement of the touch display device, and the fourth direction X4 may be a column direction of pixel arrangement of the touch display device.

It should be noted that only the third direction X3 being a horizontal direction and the fourth direction X4 being a longitudinal direction is taken as an example for illustration in a plurality of drawings in the disclosure. In the disclosure, the technical solutions obtained by rotating the drawings by 90 degrees also fall within the protection scope of the disclosure.

The first connecting part 512 and the second connecting part 522 are located in different metal layers of the touch structure at least at an intersected position, i.e., at the intersected position, one of the first connecting part 512 and the second connecting part 522 is located in the first metal layer 610 and the other is located in the second metal layer 630, and the first connecting part 512 and the second connecting part 522 are separated at the intersected position via an insulating layer 620, to prevent crosstalk of touch signals transmitted on the first connecting part 512 and the second connecting part 522.

In some embodiments, the first connecting part 512 is disposed in the first metal layer 610, two driving electrodes 511 disposed in the first metal layer 610 and adjacent along a first direction X are directly connected through the first connecting part 512; the second connecting part 522 is disposed in the second metal layer 630, two sensing electrodes 521 arranged in the first metal layer 610 and adjacent along a second direction Y are connected with the second connecting part 522 respectively through different via holes 621 in the insulating layer 620, thereby realizing connection between two sensing electrodes 521.

In some embodiments, as shown in FIG. 7, FIG. 8 and FIG. 9, the first connecting part 512 is disposed in the second metal layer 630, two driving electrodes 511 disposed in the first metal layer 610 and adjacent along a first direction X are connected with the first connecting part 512 respectively through different via holes 621 in the insulating layer 620, thereby realizing connection between two driving electrodes 511; and the second connecting part 522 is disposed in the first metal layer 610, two sensing electrodes 521 disposed in the first metal layer 610 and adjacent along a second direction Y are directly connected through the second connecting part 522.

The second connecting part 522 is disposed in the first metal layer 610, two sensing electrodes 521 disposed in the first metal layer 610 and adjacent along a second direction Y are directly connected through the second connecting part 522; the first connecting part 512 is disposed in the second metal layer 630, two driving electrodes 511 disposed in the first metal layer 610 and adjacent along a first direction X are connected with the first connecting part 512 respectively through different via holes 621 in the insulating layer 620, thereby realizing connection between two driving electrodes 511.

It should be noted that, in FIG. 8 and FIG. 9, only the case in which the driving electrode 511, the second connecting part 522 and the sensing electrode 521 are disposed in the first metal layer 610 and the first connecting part 512 is disposed in the second metal layer 630 is taken as an example for illustration; the electrical connection mode and structural figures in other cases can be derived without doubt in the same way and principle. In addition, the driving electrode 511 and the sensing electrode 521 in the figures are filled with different patterns, in order to distinguish different electrodes. The driving electrode 511 and the sensing electrode 521 can be formed with the same material and the same process.

In some embodiments, the area of the driving electrode 511 and/or the sensing electrode 521 may be 9 $mm^2$ to 25 $mm^2$, i.e., the area of at least one of the driving electrode 511 and the sensing electrode 521 may be 9 $mm^2$ to 25 $mm^2$, the area of the driving electrode 511 may be 9 $mm^2$ to 25 $mm^2$, or the area of the sensing electrode 521 may be 9 $mm^2$ to 25 $mm^2$, or the area of both the driving electrode 511 and the sensing electrode 521 may be 9 $mm^2$ to 25 $mm^2$. In the range 9 $mm^2$ to 25 $mm^2$, the value can be specifically 10 $mm^2$, 12 $mm^2$, 14 $mm^2$, 16 $mm^2$, 20 $mm^2$ or 23 $mm^2$. When the shape of the driving electrode 511 is rhombic, the lengths of both edges of the driving electrode 511 may be 3 mm to 5 mm, for example, 3.2 mm, 3.8 mm, 4 mm, 4.3 mm or 4.7 mm. In some embodiments, the length of one edge of a rhombic driving electrode is 3.8 mm, and the length of the other edge of the rhombic driving electrode is 4.7 mm; or the length of one edge of the rhombic driving electrode is 4 mm, and the length of the other edge of the rhombic driving electrode is 4.5 mm.

In a display device with a pixel density being greater than 500 PPI (pixels per inch), touch electrodes arranged in an array with an edge length being less than 0.3 mm, which are not recognizable by human eyes, can be formed through an opening design of a metal mesh, to eliminate the display defects of the reflection difference of driving electrodes composed of an edge length of 3-5 mm recognized human eyes. For medium and large-sized display devices with a pixel density being less than 400 PPI, since the area of the light emitting area of sub-pixels is large, the opening of the metal mesh 100 is limited by a resistance-capacitance load, and the edge length of the minimum touch electrode formed by the design of the opening 100A is generally greater than 0.3 mm, and the display defects of reflection difference are easily recognized by human eyes. In some embodiments of the disclosure, the touch structure 1000 uses an opening design in which a plurality of metal edges enclose an asymmetric shape. The metal mesh forms reflection in multiple directions to achieve a quasi-scattering effect when illuminated by strong light, thereby eliminating the degree of reflection difference of the metal mesh 100.

In some embodiments, the line width of the metal wire 110 may be 1 µm to 20 µm, for example, 2 µm, 3.5 µm, 4.7 µm, 8 µm, 15 µm or 18 µm. The line width of the metal wire 110 refers to the width perpendicular to an extending direction of the metal wire 110. For example, when the metal wire 110 is a linear metal wire 110L, the width of the metal wire 110 is the width of its cross section; and when the metal wire 110 is an arc metal wire 110H, the width of the metal wire 110 is the width of a cross section, and the cross section is perpendicular to the tangent direction of the cut position.

Figure 10:
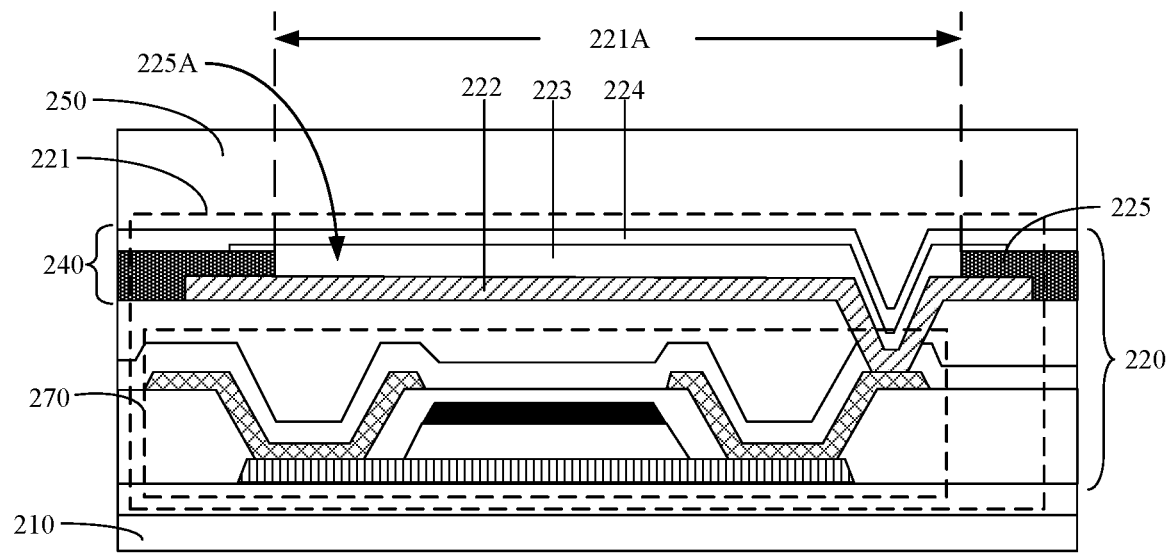
FIG. 10 is a partial sectional view of a display panel according to some embodiments.

Based on the same inventive concept, with reference to FIG. 10 and FIG. 11, embodiments of the disclosure provide a display substrate, including: a base substrate 210, a display functional layer 220 on a side of the base substrate 210, and a touch structure 1000 as provided by embodiments of the disclosure disposed on a side of the display functional layer 220 facing away from the base substrate 210; where in combination with FIG. 1E to FIG. 1H, FIG. 2E to FIG. 2K and FIG. 3E to FIG. 3H, the display functional layer 220 includes a plurality of sub-pixels 221, and an orthographic projection of at least one opening 100A on the base substrate 210 at least surrounds an orthographic projection of one sub-pixel 221 on the base substrate 210.

The touch structure 1000 may be disposed on a light emitting side of the display functional layer 220.

As shown in FIG. 10, the display functional layer 220 includes a light emitting device 240. The encapsulation layer 250 covers the light emitting device 240. The touch structure 1000 is formed on the encapsulation layer 250. In some embodiments, when the light emitting side of the display functional layer 220 may also include an anti-reflection structure (e.g., a circular polarizer), the touch structure 1000 is formed between the encapsulation layer 250 and the anti-reflection structure, and the metal mesh 100 may be directly formed on the surface of the encapsulation layer 250, i.e., no other film layer exists between the metal mesh 100 and the surface of the encapsulation layer 250.

The above base substrate 210 may be an organic substrate or an inorganic substrate. The material of the base substrate 210 may be polyethylene terephthalate (PET for short), polyimide (PI for short), cyclo olefin polymer (COP for short) or the like.

The display functional layer 220 may include a plurality of functional film layers forming the sub-pixels 221, for example, respective film layers forming the thin film transistor 270, an anode 222, a light emitting layer 223, a cathode 224 and the like. The light emitting area 221A of the sub-pixel 221 can be understood as an effective light emitting surface of the sub-pixel 221, and the contour of the light emitting area 221A of each sub-pixel 221 has at least three different extending directions.

In some embodiments, as shown in FIG. 10 and FIG. 11, the display functional layer 220 includes: a pixel defining layer 225 formed with a plurality of light outlets 225A, each light outlet 225A determines a light emitting area 221A of a sub-pixel; and the shape of the light outlet 225A is substantially the same as the shape of the light emitting area 221A of the sub-pixel 221.

The structure of the pixel defining layer 225 is similar to a mesh. A plurality of light outlets 225A are formed by blocking dams. One light outlet 225A is arranged in one sub-pixel area. The light outlet 225A is configured to determine the light emitting area 221A of the sub-pixel 221. The light emitted from the light emitting layer 223 passes through the light outlet 225A to form the light emitting area 221A. Therefore, the shape of the light outlet 225A is substantially the same as the shape of the light emitting area 221A of the sub-pixel 221.

The plurality of light outlets 225A of the light emitting areas 221A of the sub-pixels 221 of the same color in the pixel defining layer 225 may be of the same shape, and the light outlets 225A of the light emitting areas 221A of the sub-pixels 221 of different colors may be of different shapes.

In some embodiments, in combination with FIG. 1E to FIG. 1H, FIG. 2E to FIG. 2K and FIG. 3E to FIG. 3H, the sub-pixels 221 are in one-to-one correspondence with the openings 100A, and an orthographic projection of at least part of the sub-pixels 221 on the base substrate 210 is similar to the shape of an orthographic projection of the opening 100A on the base substrate 210.

In some embodiments, in combination with FIG. 1E to FIG. 1H, FIG. 2E to FIG. 2K and FIG. 3E to FIG. 3H, an orthographic projection of part of the sub-pixels 221 on the base substrate 210 goes beyond an orthographic projection of the opening 100A on the base substrate 210. Specifically, for example, an orthographic projection of the green sub-pixel G on the base substrate 210 goes beyond an orthographic projection of the opening 100A on the base substrate 210.

In some embodiments, in combination with FIG. 1E to FIG. 1H and FIG. 2E to FIG. 2K, the sub-pixels 221 include red sub-pixels R, green sub-pixels G, and blue sub-pixels B. In an overlapping unit Z, two first sub-opening units 1201 are connected by reusing the opening at which the green sub-pixels G are located; and the two second sub-opening units 1202 are connected by reusing the opening at which the green sub-pixels are located.

In some embodiments, in combination with FIG. 1F to FIG. 1I and FIG. 2F to FIG. 2K, the blue sub-pixels B include a first blue sub-pixel B1 and a second blue sub-pixel B2.

In some embodiments, as shown in FIG. 2F to FIG. 2I, an orthographic projection of the first blue sub-pixel B1 on the base substrate 210 and an orthographic projection of the second blue sub-pixel B2 on the base substrate 210 are respectively located within an orthographic projection of the adjacent first convex parts b1 on the base substrate 210 and an orthographic projection of the second convex part b2 on the base substrate 210.

Figure 1F:
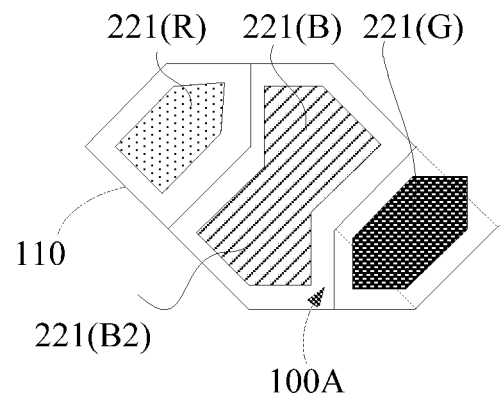
FIG. 1F is an enlarged view of an opening unit in FIG. 1E.
Figure 1G:
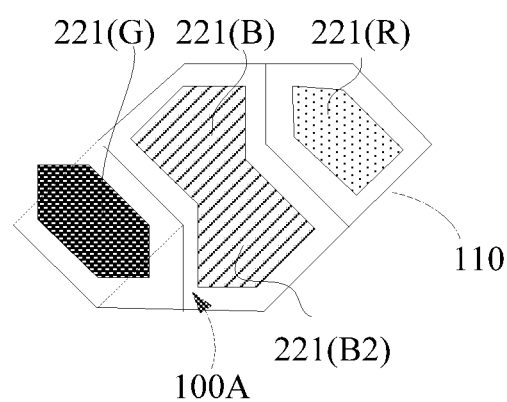
FIG. 1G is an enlarged view of the other opening unit in FIG. 1E.
Figure 1H:
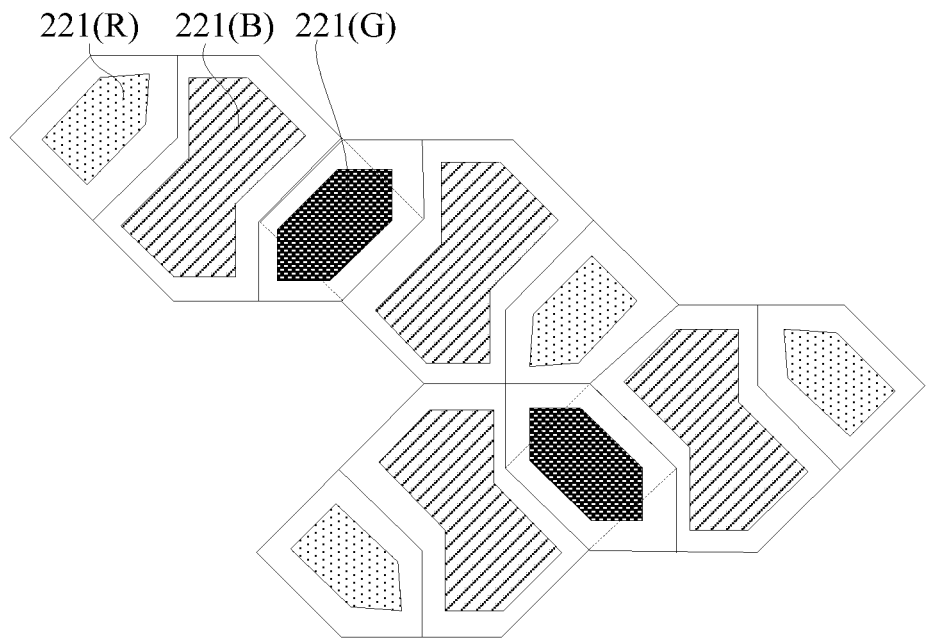
FIG. 1H is an enlarged view of a repeating unit in FIG. 1E.
Figure 1I:
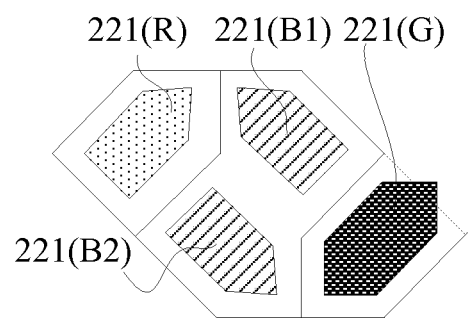
FIG. 1I is an enlarged view of another opening unit of the touch structure of FIG. 1A with sub-pixels arranged.
Figure 2F:
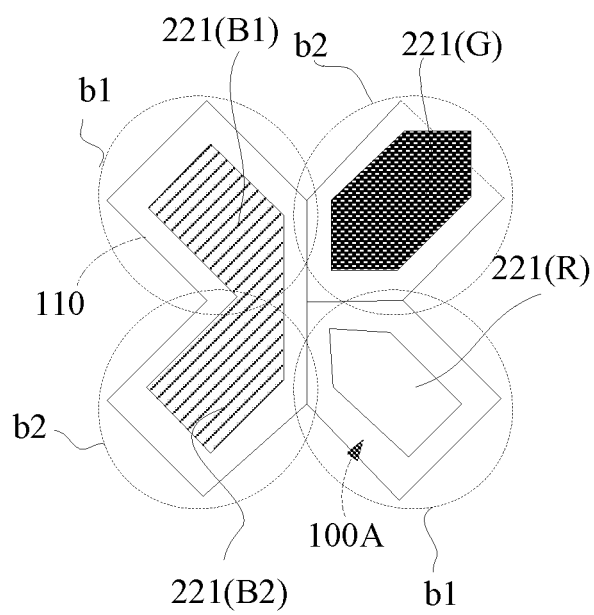
FIG. 2F is an enlarged view of an opening unit in FIG. 2E.
Figure 2G:
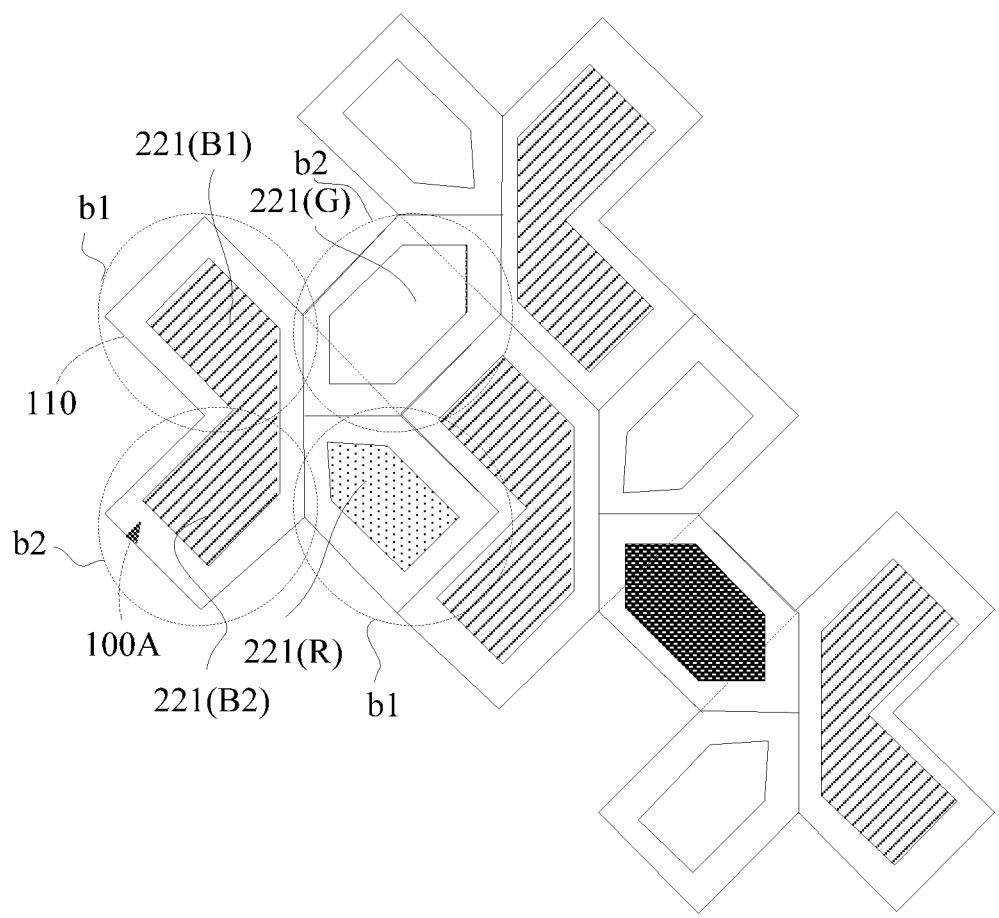
FIG. 2G is an enlarged view of a repeating unit in FIG. 2E.
Figure 2H:
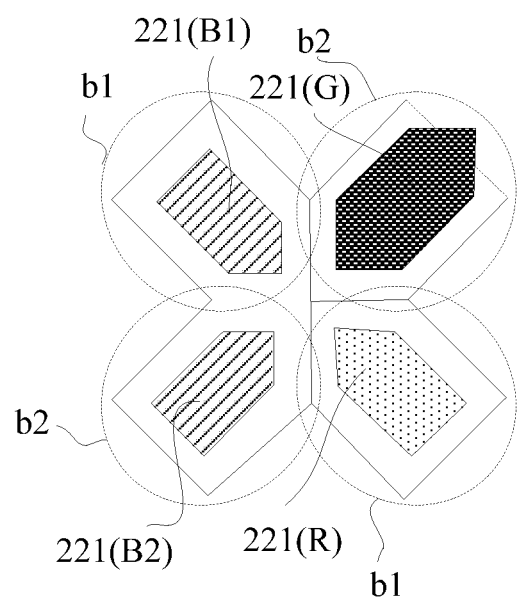
FIG. 2H is an enlarged view of another opening unit in the touch structure of FIG. 2A with sub-pixels arranged.
Figure 2I:
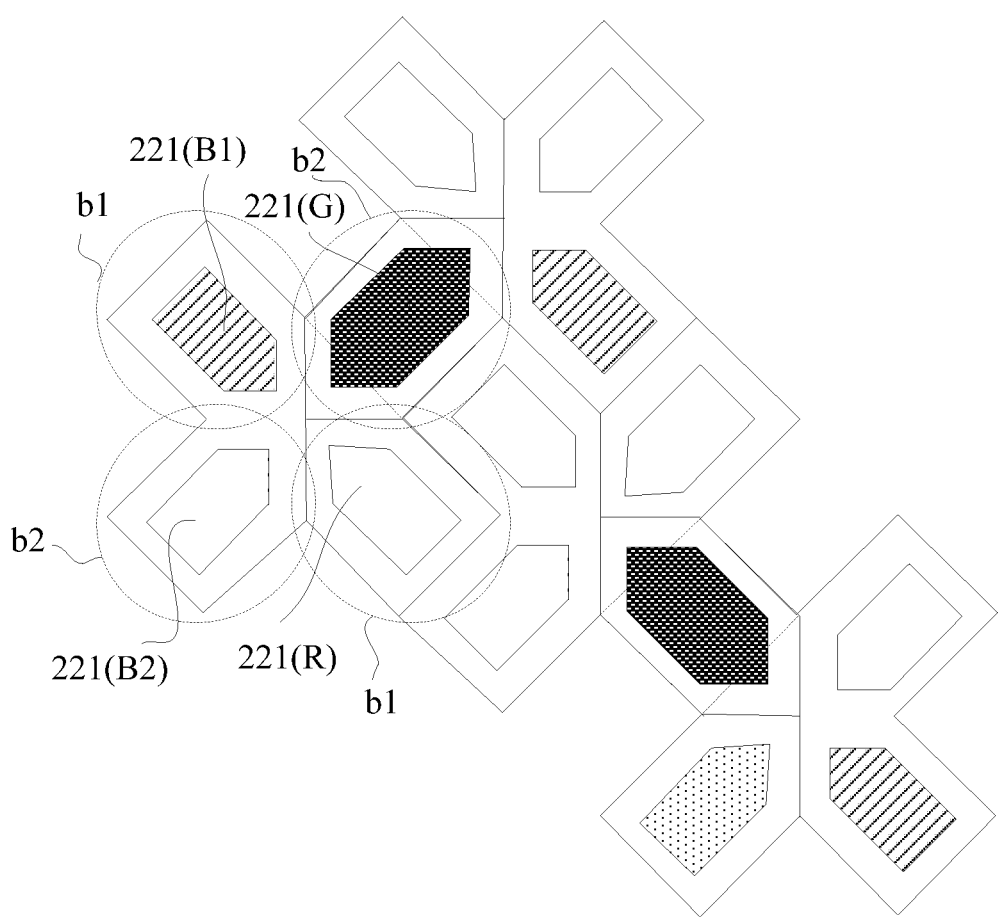
FIG. 2I is an enlarged view of another repeating unit in the touch structure of FIG. 2A with sub-pixels arranged.

In some embodiments, as shown in FIG. 1F, FIG. 1G and FIG. 2F, the first blue sub-pixel B1 and the second blue sub-pixel B2 are of an integrally connected structure.

In some embodiments, as shown in FIG. 1I, FIG. 2H to FIG. 2K, the first blue sub-pixel B1 and the second blue sub-pixel B2 are separate structures.

Figure 2J:
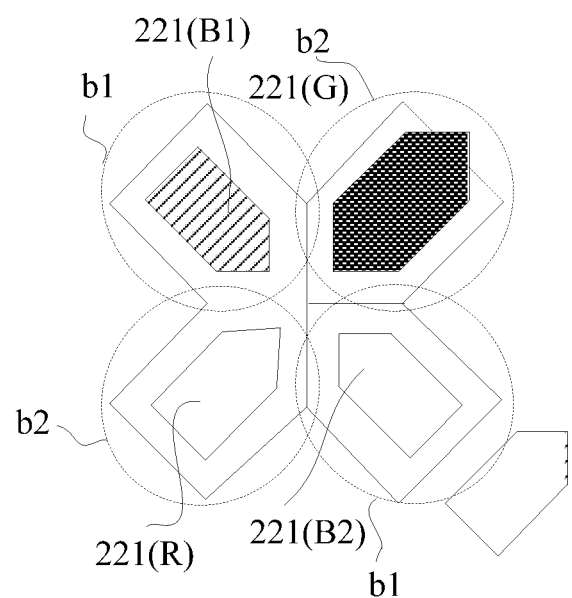
FIG. 2J is an enlarged view of another opening unit in the touch structure of FIG. 2A with sub-pixels arranged.
Figure 2K:
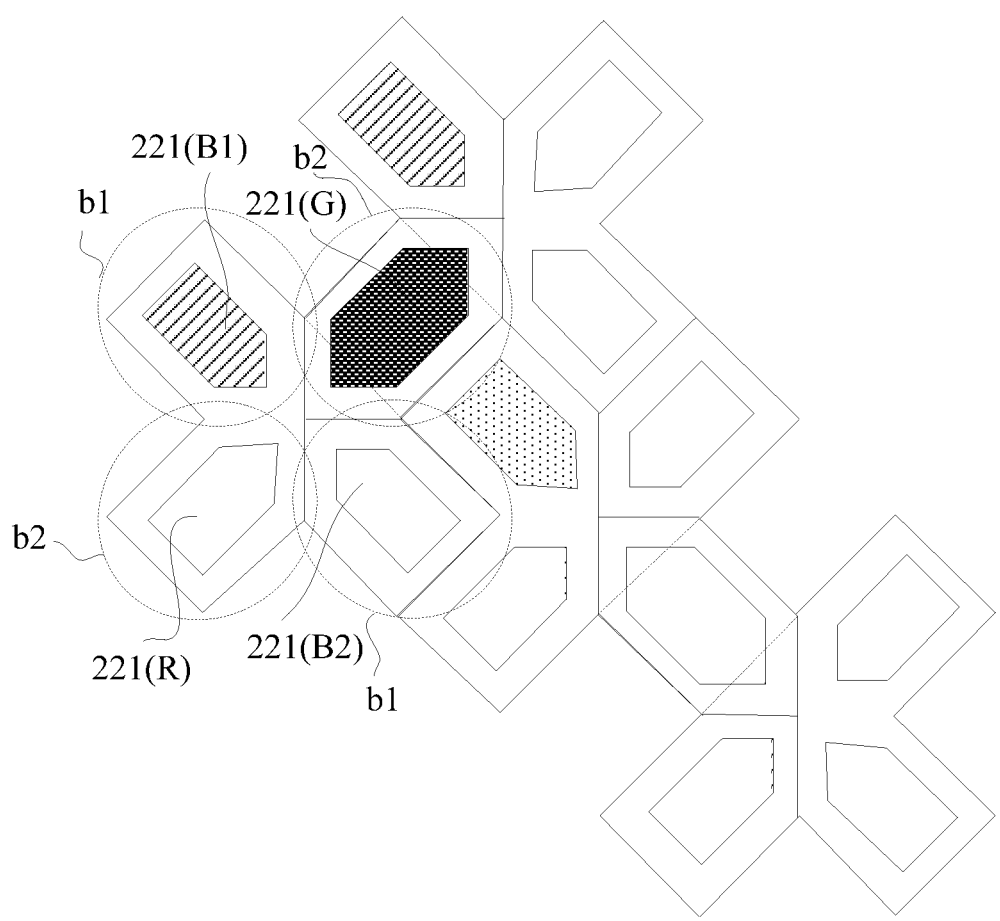
FIG. 2K is an enlarged view of another repeating unit when sub-pixels are arranged in the touch structure of FIG. 2A.

In some embodiments, as shown in FIG. 2J to FIG. 2K, the orthographic projection of the first blue sub-pixel B1 on the base substrate 210 and the orthographic projection of the second blue sub-pixel B2 on the base substrate 210 are respectively located within the orthographic projections of the two first convex parts b1 on the base substrate 210.

Based on the same inventive concept, embodiments of the disclosure further provide a touch display device, including the display panel provided in embodiments of the disclosure. The beneficial effects realized by the touch display device are the same as the beneficial effects achieved by the display panel 900 in the above embodiments, and each structure of the touch display device has been described above, and will not be repeated redundantly herein.

Although preferred embodiments of the present invention have been described, additional changes and modifications may be made to these embodiments once basic inventive concepts are known to those skilled in the art. Therefore, the appended claims are intended to be interpreted to encompass preferred embodiments and all the variations and modifications falling within the scope of the present invention.

Evidently those skilled in the art can make various modifications and variations to the embodiments of the present invention without departing from the spirit and scope of the embodiments of the present invention. Thus the present invention is also intended to encompass these modifications and variations thereto so long as the modifications and variations come into the scope of the claims appended to the embodiments of the present invention and their equivalents.

The invention claimed is:

1. A touch structure, comprising:
   a metal mesh, comprising a plurality of metal wires;
   wherein the metal mesh has a plurality of opening units, each of the opening units comprises at least three openings, each of the openings is enclosed by a plurality of metal wires, and the plurality of metal wires enclosing each of the openings have at least three different extending directions; at least one of the metal wires separating the openings in the opening unit and each of the metal wires forming an outer boundary of the opening unit have different extending directions;
   wherein the metal wires forming the outer boundary of the opening unit at least comprise one pair of metal wires with a same extending direction;
   the outer boundary of the opening unit is a hexagon with opposite sides parallel, and the metal wires forming the outer boundary of the opening unit comprise:
      two first metal wires arranged oppositely and in parallel;
      two second metal wires arranged oppositely and in parallel; and
      two third metal wires arranged oppositely and in parallel;
      wherein one of the two second metal wires connects one of the two first metal wires and one of the two third metal wires, and other one of the two second metal wires connects other one of the two first metal wires and other one of the two third metal wires;
   wherein a length of the third metal wire is greater than a length of the first metal wire;
   the length of the first metal wire is greater than a length of the second metal wire; and
   the second metal wire is perpendicular to the third metal wire connected with the second metal wire;
   wherein in the opening unit, a first included angle formed between the first metal wire and the second metal wire connected with the first metal wire is same as a second included angle formed between the first metal wire and the third metal wire connected with the first metal wire.

2. The touch structure of claim 1, wherein a quantity of the metal wires forming the outer boundary of the opening unit is greater than a quantity of the metal wires inside the opening unit.

3. The touch structure of claim 1, wherein in the opening unit, the first included angle formed between the first metal wire and the second metal wire is in a range of 120° to 150°.

4. The touch structure of claim 1, wherein the opening unit comprises:
   two fourth metal wires extending from a midpoint of the first metal wire and perpendicular to the first metal wire; and
   two fifth metal wires extending along a direction parallel to the second metal wire and respectively connecting other end of the fourth metal wire and a midpoint of the third metal wire.

5. The touch structure of claim 1, wherein the opening unit comprises:
   a first sub-opening unit and a second sub-opening unit;
   wherein a pattern of the first sub-opening unit and a pattern of the second sub-opening unit are mirror symmetrical; and
   the two first sub-opening units and the two sub-opening units form a repeating unit;
   in the repeating unit:
      two of the first sub-opening units are connected by reusing an opening to form a first combination; and
      two of the second sub-opening units are connected by reusing one opening to form a second combination;
      wherein the repeating unit is formed by reusing two adjacent metal wires on an outer boundary of the first combination as metal wires of two different second sub-opening units.

6. A display panel, comprising:
   a base substrate;
   a display functional layer on a side of the base substrate; and
   the touch structure according to claim 1 on a side of the display functional layer facing away from the base substrate;
   wherein the display functional layer comprises a plurality of sub-pixels, and an orthographic projection of at least one of the openings on the base substrate at least surrounds an orthographic projection of one of the sub-pixels on the base substrate.

* * * * *